US009406344B2

United States Patent
Hirabayashi

(10) Patent No.: US 9,406,344 B2
(45) Date of Patent: Aug. 2, 2016

(54) OPTICAL INFORMATION RECORDING/REPRODUCTION DEVICE, AND OPTICAL INFORMATION RECORDING/REPRODUCTION METHOD

(75) Inventor: Masayuki Hirabayashi, Tokyo (JP)

(73) Assignee: HITACHI CONSUMER ELECTRONICS CO., LTD., Kanagawa (JP)

( * ) Notice: Subject to any disclaimer, the term of this patent is extended or adjusted under 35 U.S.C. 154(b) by 0 days.

(21) Appl. No.: 14/372,288

(22) PCT Filed: Jan. 16, 2012

(86) PCT No.: PCT/JP2012/000195
§ 371 (c)(1),
(2), (4) Date: Sep. 15, 2014

(87) PCT Pub. No.: WO2013/108284
PCT Pub. Date: Jul. 25, 2013

(65) Prior Publication Data
US 2015/0009788 A1 Jan. 8, 2015

(51) Int. Cl.
| | |
|---|---|
| *G11B 7/0065* | (2006.01) |
| *G11B 27/36* | (2006.01) |
| *G11B 20/18* | (2006.01) |
| *G11B 7/0045* | (2006.01) |
| *G11B 20/10* | (2006.01) |
| *G11B 19/04* | (2006.01) |

(Continued)

(52) U.S. Cl.
CPC .............. *G11B 27/36* (2013.01); *G11B 7/0065* (2013.01); *G11B 7/00458* (2013.01); *G11B 20/18* (2013.01); *G11B 20/1816* (2013.01); *G11B 20/1879* (2013.01); *G11B 20/1883* (2013.01); *G11B 19/041* (2013.01); *G11B 20/10305* (2013.01); *G11B 2007/0009* (2013.01); *G11B 2020/183* (2013.01); *G11B 2220/2504* (2013.01); *G11C 13/045* (2013.01)

(58) Field of Classification Search
None
See application file for complete search history.

(56) References Cited

U.S. PATENT DOCUMENTS

| | | | |
|---|---|---|---|
| 8,050,165 B2 | 11/2011 | Nagai et al. | |
| 2007/0002715 A1* | 1/2007 | Hayashi et al. | ............... 369/103 |
| 2008/0062796 A1* | 3/2008 | Bates | ................... G11B 7/0065 365/216 |

(Continued)

FOREIGN PATENT DOCUMENTS

| | | |
|---|---|---|
| CN | 101599279 A | 12/2009 |
| JP | 2009-87447 A | 4/2009 |

(Continued)

OTHER PUBLICATIONS

Office Action, mailed Dec. 28, 2015, which issued during the prosecution of Chinese Patent Application No. 201280071441.X, which corresponds to the present application.

*Primary Examiner* — Brian Butcher
(74) *Attorney, Agent, or Firm* — Baker Botts L.L.P.

(57) ABSTRACT

Provided are an optical information recording/reproduction device and an optical information recording/reproduction method with which retry data during verify error detection can be efficiently recorded. In the optical information recording/reproduction device for recording data on an optical information recording media and reproducing data from an optical information recording medium, if verify error data is detected at a first cure unit region on the optical information recording medium, verify error retry data is recorded at a second cure unit region which is different to the first cure unit region.

3 Claims, 17 Drawing Sheets

(51) Int. Cl.
*G11B 7/00* (2006.01)
*G11C 13/04* (2006.01)

(56) References Cited

U.S. PATENT DOCUMENTS

2008/0218892 A1* 9/2008 Haustein et al. ............ 360/69
2009/0296558 A1* 12/2009 Akahoshi ................... 369/103
2009/0310463 A1* 12/2009 Nagai et al. ................ 369/103

FOREIGN PATENT DOCUMENTS

| | | |
|---|---|---|
| JP | 2009-145462 A | 7/2009 |
| JP | 2009-289384 A | 12/2009 |
| JP | 2009-301627 A | 12/2009 |

* cited by examiner

OPTICAL INFORMATION RECORDING/REPRODUCTION DEVICE, AND OPTICAL INFORMATION RECORDING/REPRODUCTION METHOD

TECHNICAL FIELD

The present invention relates to an optical information recording and reproducing apparatus, and an optical information recording and reproducing method.

BACKGROUND ART

In the midst of studies conducted concerning the storage technique in the next generation, the hologram recording technique in which digital information (info) is recorded utilizing the holography is attracting attention.

The hologram recording technique is a technique of superposing a signal beam having information of page data modulated two-dimensionally by a spatial light modulator on a reference (ref) beam within recording media, causing refractive index modulation in the recording media by using an interference fringe pattern generated at that time, and thereby recording information. When reproducing information, the recording media is irradiated with the reference beam used at the time of recording in the same arrangement and consequently a hologram recorded in the recording media acts like a diffraction grating and generates a diffracted beam. This diffracted beam is reproduced as the same beam as the recorded signal beam inclusive of phase information.

The reproduced signal beam is detected fast two-dimensionally by using photodetectors such as CMOSs or CCDs. In such hologram recording, two-dimensional information is recorded/reproduced simultaneously by using one hologram and a plurality of page data can be written in superposition on the same place. Therefore, such hologram recording is effective for fast recording and reproducing of a large capacity of information.

JP-A-2009-87447 (Patent Literature 1) describes "after data is recorded, data is verified as occasion demands (S27), and post cure is conducted by using an optical beam emitted from a disk cure optical system 13 (S28)".

CITATION LIST

Patent Literature

PATENT LITERATURE 1: JP-A-2009-87447

SUMMARY OF INVENTION

Technical Problem

Patent Literature simply expresses the description, and a concrete configuration of the verify processing is not disclosed at all.

Therefore, an object of the present invention is to provide an optical information recording and reproducing apparatus and an optical information recording and reproducing method which make it possible to conduct verify efficiently.

Solution to Problem

In order to achieve the object, for example, a configuration described in claims is adopted.

The present application includes a plurality of means for achieving the object. An example of them is an optical information recording and reproducing method for recording data on optical information recording media and reproducing data from the optical information recording media, the optical information recording and reproducing method including the steps of storing data to be recorded on the optical information recording media into a storage unit, executing precure on a first cure unit area of the optical information recording media as a preprocess for recording, recording the data stored in the storage unit into the first cure unit area subjected to the precure, executing postcure on the first cure unit area subjected to the data recording, as a postprocess for recording, executing verify to determine whether data in the first cure unit area subjected to the postcure can be read out correctly, and responsive to detection of data causing a verify error in the first cure unit area by the verify, recording retry data for the verify error into a second cure unit area on the optical information recording media different from the first cure unit area.

Advantageous Effects of Invention

According to the present invention, it is possible to conduct verify efficiently.

Objects, configurations and effects other than those described above will be elucidated by the ensuing description of embodiments.

DESCRIPTION OF EMBODIMENTS

Hereafter, embodiments will be described with reference to the drawings.
Embodiment 1

In an optical information recording and reproducing apparatus in an embodiment according to the present invention, a signal beam and a reference beam are incident on optical information recording media of write-once type (hereafter referred to simply as optical information recording media) so as to be superposed on each other and information is recorded by forming an interference fringe pattern. At this time, recording using angular multiplexing is possible by changing an incidence angle of the reference beam which is incident on the optical information recording media.

In a hologram recorded on a same area with reference beam angles changed, a hologram corresponding to each reference beam angle will be hereafter referred to as page, and a set of pages angular-multiplexed on the same area will be hereafter referred to as book.

Furthermore, when recording information in a desired position in the optical information recording media, a preprocess called precure is needed. In the precure, a desired position is previously irradiated with a predetermined optical beam before irradiating the desired position with a reference beam and a signal beam. After information is recorded in the desired position, a post-process called postcure is needed. In the postcure, the desired position is irradiated with a predetermined optical beam in order to make incremental recording in the desired position impossible. It is now supposed that a laser light source that emits an optical beam used for precure and postcure is different from a laser light source that emits the signal beam and the reference beam. By the way, if the laser light source used for precure and postcure can be made the same as the laser light source used for the signal beam and the reference beam, such a configuration may be used.

Since each of the precure and postcure takes a predetermined processing time, it is necessary to conduct each processing on a plurality of books collectively in order to make the processing fast.

Here, an area of precure and postcure conducted once on a plurality of book areas is referred to as cure unit area, and its data capacity is referred to as cure capacity. A data capacity which can be recorded by conducting the precure and postcure once is, for example, 2 G-bytes composed of 100 books, and this data capacity is the cure capacity. One book is, for example, 20 M-bytes composed of 300 pages.

Figure 1:
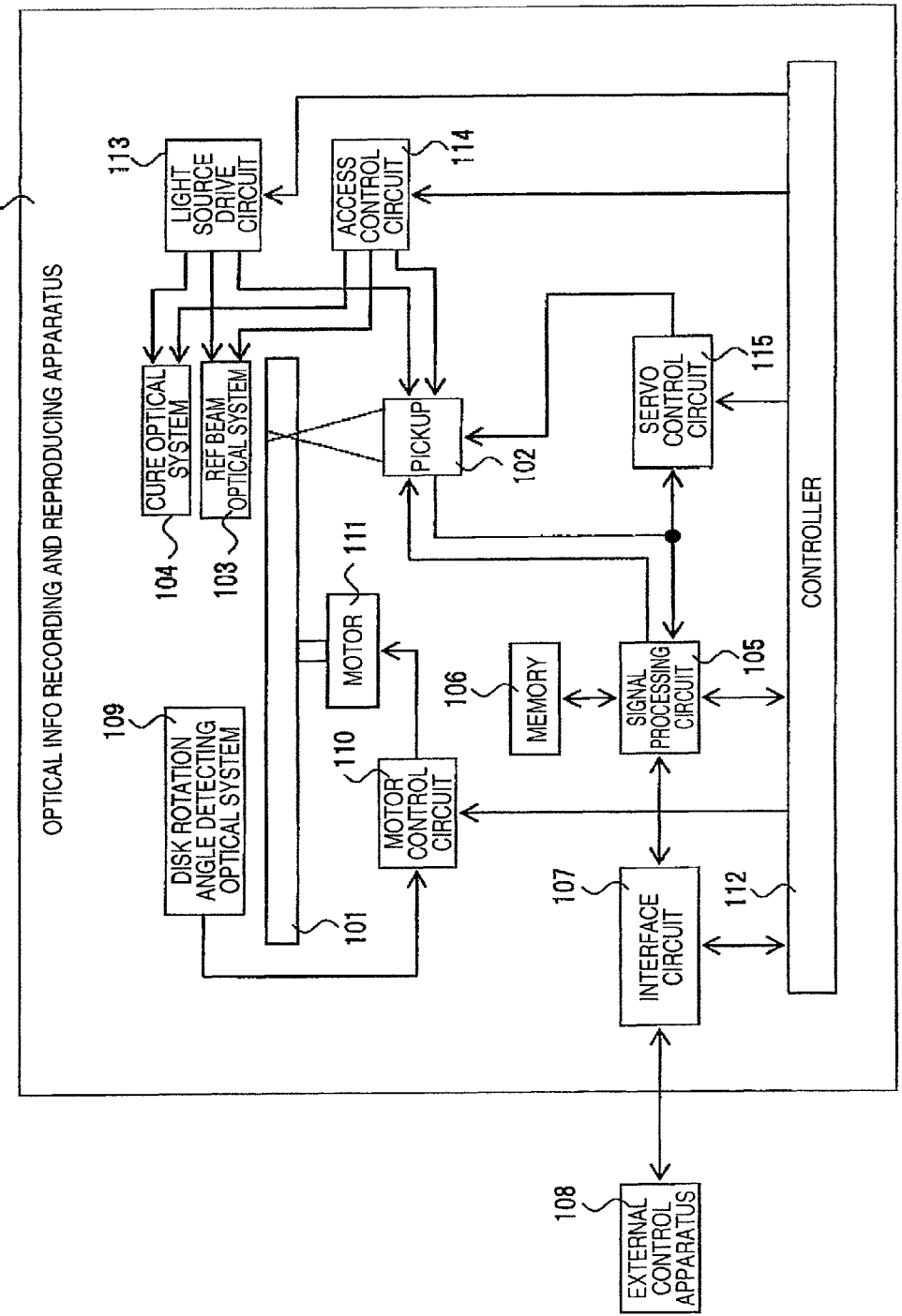
FIG. 1 is a block diagram showing a configuration of an optical information recording and reproducing apparatus in a first embodiment.

FIG. 1 is a block diagram showing a configuration of an optical information recording and reproducing apparatus in the first embodiment.

An optical information recording and reproducing apparatus 100 is connected to an external control apparatus 108. The optical information recording and reproducing apparatus 100 records data input from the external control apparatus 108, onto optical information recording media 101. Furthermore, the optical information recording and reproducing apparatus 100 outputs data, which is reproduced from the optical information recording media 101, to the external control apparatus 108.

The optical information recording media 101 has a configuration which can be rotated by a rotating motor 111. Since a pickup 102, a reference beam optical system 103, and a cure optical system 104 are configured to be movable in the radial direction, information can be recorded over the whole face of the optical information recording media 101 by using holography.

For recording information, it is necessary to irradiate the optical information recording media 101 with a signal beam and a reference beam. The pickup 102 irradiates the optical information recording media 101 with the signal beam. The reference beam optical system 103 irradiates the optical information recording media 101 with the reference beam.

At this time, data to be recorded is sent into a spatial light modulator in the pickup 102 via a signal processing circuit 105, and the signal beam is modulated by the spatial light modulator.

For reproducing information from holography, it is necessary to irradiate the optical information recording media 101 with a reference beam and detect a reproduced beam. The reference beam optical system 103 irradiates the optical information recording media 101 with the reference beam. The pickup 102 detects a reproduced beam reproduced at that time by using a photodetector in the pickup 102, and sends a result of the detection to the signal processing circuit 105.

In addition, the pickup 102 detects a deviation quantity of the reference beam angle by using a mechanism for detecting the deviation quantity, and sends the deviation quantity to a servo control circuit 115.

The cure optical system 104 generates an optical beam to be used for the precure and postcure of the optical information recording media 101.

The signal processing circuit 105 sends data, which is sent from the external control apparatus 108 via an interface circuit 107, to a memory 106, divides the data into a plurality of data strings, adds an error detection code such as a CRC (Cyclic Redundancy Check) to each data string to make possible error detection at the time of reproducing, makes the number of on-pixels nearly equal to the number of off-pixels, conducts scrambling of adding a pseudo random number data string to each data string with the object of preventing repetition of the same pattern, and then adds an error correcting code such as the Reed-Solomon code to make possible error correction at the time of reproducing. By the way, the present invention is not restricted to the case of the CRC or the Reed-Solomon code.

And the signal processing circuit 105 converts the data string to M by N two-dimensional data, repeats the conversion by a number of times corresponding to one page data, and thereby constitutes two-dimensional data corresponding to one page. The signal processing circuit 105 adds markers, which become reference in image position detection and image distortion correction at the time of reproducing, to the two-dimensional data constituted in this way, and sends resultant data to the pickup 102.

Or the signal processing circuit 105 receives the detected image data from the pickup 102, detects an image position by using the markers included in the image data as reference, corrects image distortions such as the inclination, magnification and distortion, then conducts binarization processing, removes the markers, thereby acquires two-dimensional data corresponding to one page, and stores the two-dimensional data into the memory 106. The signal processing circuit 105 converts the two-dimensional data obtained in this way to a plurality of data strings, then conducts error correction processing, conducts descrambling, conducts error detection processing using the CRC, and sends resultant data strings to the external control apparatus 108 via the interface circuit 107.

The memory 106 is a storage unit for temporarily storing data. The memory 106 is controlled by the signal processing circuit 105, and used as a buffer memory, an error correcting code adding memory, an error correcting memory, and the like. The memory 106 may be any memory as long as it can retain data, such as, for example, the SSD (Solid State Drive), besides the DRAM (Dynamic Random Access Memory) and the SRAM (Static Random Access Memory). The memory 106 may be the HDD (Hard Disk Drive).

The interface circuit 107 conveys an order given by the external control apparatus 108, to a controller 112. Furthermore, the interface circuit 107 sends data sent from the signal processing circuit 105, to the external control apparatus 108. Furthermore, the interface circuit 107 sends a recording/reproducing order sent from the external control apparatus 108, to the signal processing circuit 105. The interface circuit 107 conducts data transfer based on a transfer system such as, for example, the SATA (Serial Advanced Technology Attachment), the SAS (Serial Attached SCSI) or the like.

The external control apparatus 108 sends data to the optical information recording and reproducing apparatus 100, and orders the optical information recording and reproducing apparatus 100 to record the data. Furthermore, the external control apparatus 108 orders the optical information recording and reproducing apparatus 100 to reproduce data, and receives the data.

A disk rotation angle detecting optical system 109 detects a rotation angle of the optical information recording media 101, and sends the rotation angle to a motor control circuit 110.

The motor control circuit 110 adjusts the rotation angle of the optical information recording media 101. When adjusting the optical information recording media 101 to a predetermined rotation angle, the rotation angle detecting optical system 109 detects a signal depending upon the rotation angle, the motor control circuit 110 controls the rotating motor 111 by using the detected signal, and thereby the rotation angle of the optical information recording media 101 is adjusted as ordered by the controller 112.

The rotating motor 111 is controlled by the motor control circuit 110 to rotate the optical information recording media 101.

The controller 112 controls respective units in the optical information recording and reproducing apparatus 100, and conducts data recording processing and data reproducing processing of the optical information recording media 101. The controller 112 may be constituted by using, for example, a CPU (Central Processing Unit). Alternatively, an arbitrary control circuit or a dedicated circuit such as an ASIC may be used.

A light source drive circuit 113 supplies predetermined light source drive currents to light sources in the pickup 102, the reference beam optical system 103 and the cure optical system 104, respectively. An optical beam is emitted with a predetermined quantity of light from each of the light sources.

A mechanism for sliding the position in the radial direction of the optical information recording and reproducing media 101 is provided in each of the pickup 102, the reference beam optical system 103, and the cure optical system 104. An access control circuit 114 exercises position control of them in response to an order given by the controller 112.

In the recording technique utilizing the principle of the angular multiplexing of holography, there is a tendency that the allowable error for the deviation of the reference beam angle becomes extremely small. Therefore, a deviation quantity of the reference beam angle given by the pickup 102 is input to the servo control circuit 115, and the servo control circuit 115 corrects the deviation quantity of the pickup 102.

As for the pickup 102, the reference beam optical system 103, the cure optical system 104 and the disk rotation angle detecting optical system 109, some optical system configurations or all optical system configurations may be thrown into one for simplification.

Operation of the optical information recording and reproducing apparatus 100 conducted when recording data on the optical information recording media 101 will now be described. Upon attachment of the optical information recording media 101 to the optical information recording and reproducing apparatus 100, the controller 112 conducts adjustment processing of the respective units, moves the pickup 102 and the reference beam optical system 103 respectively to predetermined positions by using the motor control circuit 110 and the access control circuit 114, reads out management information from the optical information recording media 101 via the pickup 102 and the signal processing circuit 105, and stores the management information into the memory 106.

And the controller 112 moves the pickup 102, the reference beam optical system 103 and the cure optical system 104 to their respective desired positions, by using the motor control circuit 110 and the access control circuit 114.

Upon sending of data from the host computer 108 to the optical information recording and reproducing apparatus 100, the controller 112 receives the data by using the interface circuit 107, stores the data into the memory 106, and conducts CRC addition, scrambling and error correcting code addition by using the signal processing circuit 105.

And the controller 112 moves the pickup 102 and the reference beam optical system 103 to their respective desired positions by using the motor control circuit 110 and the access control circuit 114. The controller 112 conducts precure by using the cure optical system 104. The controller 112 reads out data from the memory 106, adds markers to the data, sends resultant data to the pickup 102, and records the resultant data on the optical information recording media 101, by using the signal processing circuit 105. And the controller 112 conducts the postcure by using the cure optical system 104.

When conducting verify processing, i.e., when ascertaining whether recorded data can be read out correctly, image data detected from the optical information recording media 101 is sent to the signal processing circuit 105, the image position is detected by using the markers as reference, and distortions are corrected. Then, binarization processing is conducted, and two-dimensional data is acquired and stored into the memory 106. And the two-dimensional data is converted to a plurality of data strings, then error correction processing is conducted, descrambling is conducted, and error detection processing using the CRC is conducted. If an error is detected here, the controller 112 is informed of a verify error and the controller 112 conducts retry by controlling respective units. At the time of the retry, data resulting in non-coincidence is recorded in a head position of the next cure.

Or the signal processing circuit 105 compares data at the time of recording with data at the time of verify processing. Upon non-coincidence, the signal processing circuit 105 informs the controller 112 of a verify error. When writing data into the memory 106 in the verify processing in this case, it is necessary to write the data in a place different from the place where the data was written at the time of recording.

And verify processing of the retried data is conducted. If the result is not a verify error, registration in the management information as alternating data is conducted. If the result is a verify error, retry processing is conducted again.

Operation of the optical information recording and reproducing apparatus 100 conducted when reproducing data from the optical information recording media 101 will now be described. Upon attachment of the optical information recording media 101 to the optical information recording and reproducing apparatus 100, the controller 112 conducts adjustment processing of the respective units, moves the pickup 102 and the reference beam optical system 103 to their respective predetermined positions by using the motor control circuit 110 and the access control circuit 114, reads out management information from the optical information recording media 101 via the pickup 102 and the signal processing circuit 105, and stores the management information into the memory 106.

And the controller 112 moves the pickup 102 and the reference beam optical system 103 to their respective desired positions by using the motor control circuit 110 and the access control circuit 114. The controller 112 writes data reproduced from the optical information recording media 101, into the memory 106. The controller 112 conducts error correction processing, descrambling, and error detection processing by using the signal processing circuit 105.

And the controller 112 reads out data from the memory 106, and sends the data to the external control apparatus 108 via the interface circuit 107.

Figure 2:
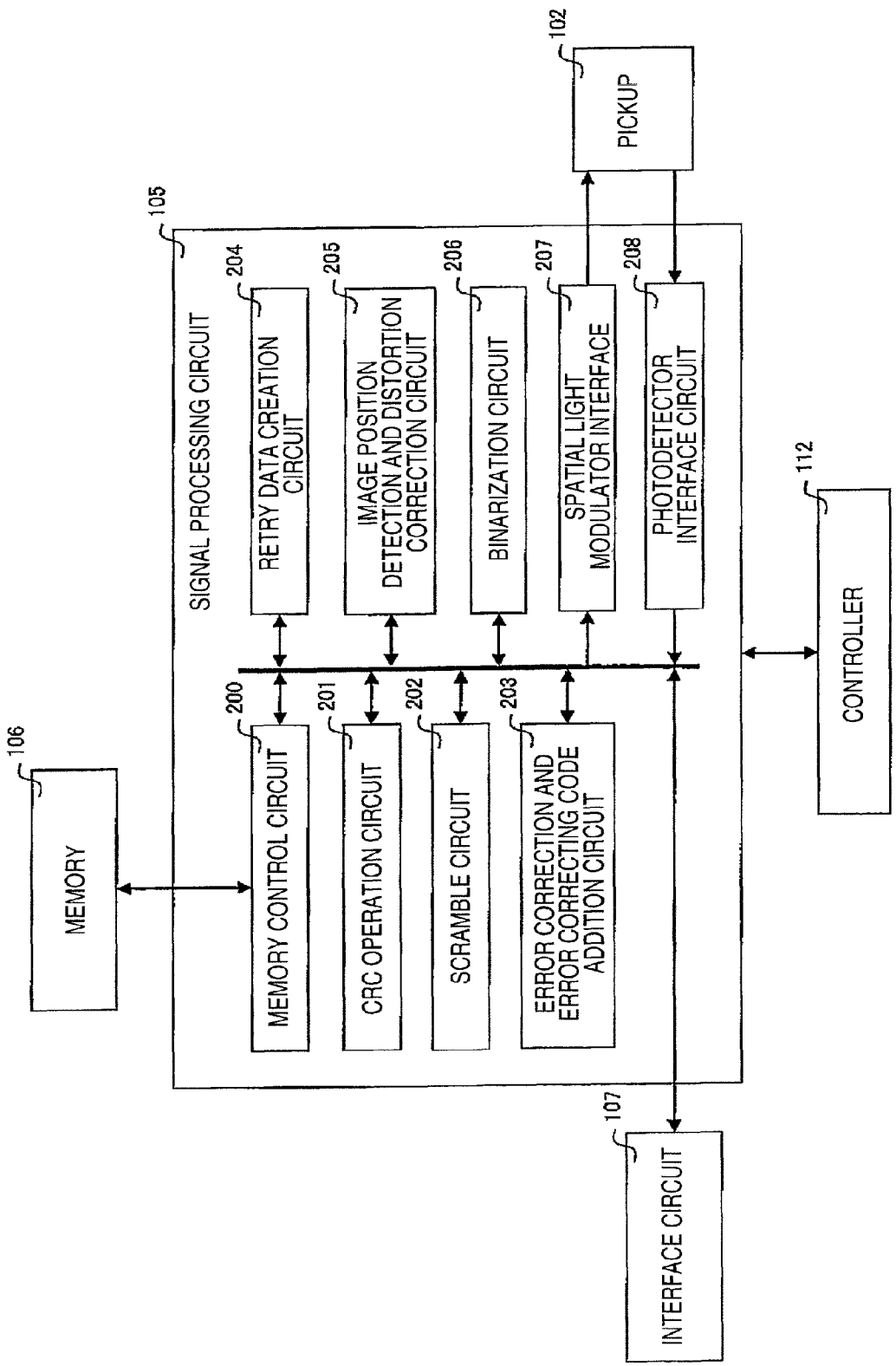
FIG. 2 is a block diagram showing a configuration of a signal processing circuit in the optical information recording and reproducing apparatus in the first embodiment.

FIG. 2 is a block diagram showing a configuration of the signal processing circuit in the optical information recording and reproducing apparatus in the first embodiment.

The signal processing circuit 105 is controlled by the controller 112. The signal processing circuit 105 stores data sent from the interface circuit 107 into the memory 106, conducts various kinds of signal processing on the memory, and sends resultant data to the pickup 102.

Or the signal processing circuit 105 stores image data sent from the pickup 102 into the memory 106, conducts various kinds of signal processing on the memory, extracts data, and sends the extracted data to the interface circuit 107.

A memory control circuit 200 conducts data writing into/reading from the memory 106 in response to a data input/output request from each circuit.

A CRC operation circuit 201 operates a CRC of each data string on the memory 106 and adds the CRC to the data string. Or the CRC operation circuit 201 operates a CRC of each data string and detects an error.

A scramble circuit 202 conducts scrambling on data strings in the memory 106. Or the scramble circuit 202 descrambles the data strings.

An error correction and error correcting code addition circuit 203 adds an error correcting code on the memory 106. Or the error correction and error correcting code addition circuit 203 corrects an error included in data which is stored in the memory 106.

In order to copy data in a certain place on the memory 106 and paste the data in the next place, a retry data creation circuit 204 shifts data in the paste destination backward, and then conducts paste. Details will be described later.

An image position detection and distortion correction circuit 205 exercises control to detect markers from image data stored in the memory 106 and extract an effective data range, corrects image distortions such as the inclination, magnification and distortion, and converts image data to an expected size of two-dimensional data.

A binarization circuit 206 binarizes each bit data of a plurality of bits which constitute the two-dimensional data subjected to the size conversion, to "0" or "1," and stores data into the memory 106 in the output row of reproduced data.

A spatial light modulator interface circuit 207 reads out data with an error correcting code added from the memory 106 in the row order of the two-dimensional data, adds markers which become reference at the time of reproducing, and then outputs the two-. dimensional data to the spatial light modulator in the pickup 102.

Image data from the photodetector in the pickup 102 is input to a photodetector interface circuit 208. The photodetector interface circuit 208 writes the image data into the memory 106.

Although not illustrated, respective circuits are controlled by the controller 112. Or a dedicated controller may be provided in the signal processing circuit 105 to control the respective circuits.

Operation of the signal processing circuit 105 conducted when recording data on the optical information recording media 101 will now be described.

The signal processing circuit 105 stores data, which is sent from the interface circuit 107, into the memory 106 via the memory control circuit 200, and divides the data into a plurality of data strings. And the signal processing circuit 105 adds a CRC to each data string by using the CRC operation circuit 201 to make possible error detection at the time of reproducing, makes the number of on-pixels nearly equal to the number of off-pixels, conducts scrambling of adding a pseudo random number data string to each data string by using the scramble circuit 202 with the object of preventing repetition of the same pattern, and then adds an error correcting code such as the Reed-Solomon code by using the error correction and error correcting code addition circuit 203 to make possible error correction at the time of reproducing. And the signal processing circuit 105 converts the data string to M by N two-dimensional data by using the memory control circuit 200, repeats the conversion by a number of times corresponding to one page data, and thereby constitutes two-dimensional data corresponding to one page. The signal processing circuit 105 adds markers, which become reference in image position detection and image distortion correction at the time of reproducing, to the two-dimensional data constituted in this way by using the spatial light modulator interface circuit 207, and sends resultant data to the spatial light modulator in the pickup 102.

If data sent from the interface circuit 107 is less than the cure capacity, the signal processing circuit 105 copies the data and pastes the data to satisfy the cure capacity by using the retry data creation circuit 204. If remainder data which does not satisfy the cure capacity is generated even if the data sent from the interface circuit 107 is at least the cure capacity,. the signal processing circuit 105 copies the data and pastes the data to satisfy the cure capacity by using the retry data creation circuit 204 in the same way.

When conducting verify processing, the signal processing circuit 105 receives the detected image data from the photodetector in the pickup 102 by using the photodetector interface circuit 208, stores the detected image data into the memory 106 via the memory control circuit 200, detects the markers included in the image data and detects the effective data range by using the image position detection and distortion correction circuit 205, corrects image distortions such as the inclination, magnification and distortion by using the detected markers, and converts image data to an expected size of two-dimensional data. And the signal processing circuit 105 binarizes each bit data of a plurality of bits which constitute the two-dimensional data subjected to the size conversion by using the binarization circuit 206, and exercises control to store data into the memory 106 in the output row of reproduced data. The signal processing circuit 105 conducts error correction processing on the data string obtained in this way by using the error correction and error correcting code addition circuit 203, conducts descrambling by using the scramble circuit 202, and conducts error detection processing by using the CRC operation circuit 201.

If an error is detected in the error correction processing, the CRC operation processing, or the like, then the signal processing circuit 105 copies original data of the data and pastes the copied data to cause it to cut in at the head of the next cure to be recorded. At that time, data in the next cure to be recorded is shifted backward by the amount of the data to be pasted.

Operation of the signal processing circuit 105 conducted when reproducing data from the optical information recoding media 101 will now be described.

The signal processing circuit 105 receives detected image data from the photodetector in the pickup 102 by using the photodetector interface circuit 209, stores the detected image data into the memory 106 via the memory control circuit 200, detects markers included in the image data and extracts an effective data range by using the image position detection and distortion correction circuit 205, corrects image distortions such as the inclination, magnification and distortion by using the detected markers, and converts image data to an expected size of two-dimensional data. And the signal processing circuit 105 binarizes each bit data of a plurality of bits which constitute the two-dimensional data subjected to the size conversion by using the binarization circuit 206, and exercises control to store data into the memory 106 in the output row of reproduced data. The signal processing circuit 105 conducts error correction processing on the data string obtained in this way by using the error correction and error correcting code addition circuit 203, conducts descrambling by using the scramble circuit 202, conducts error detection processing by using the CRC operation circuit 201, and sends resultant data string to the interface circuit 107.

Figure 3:
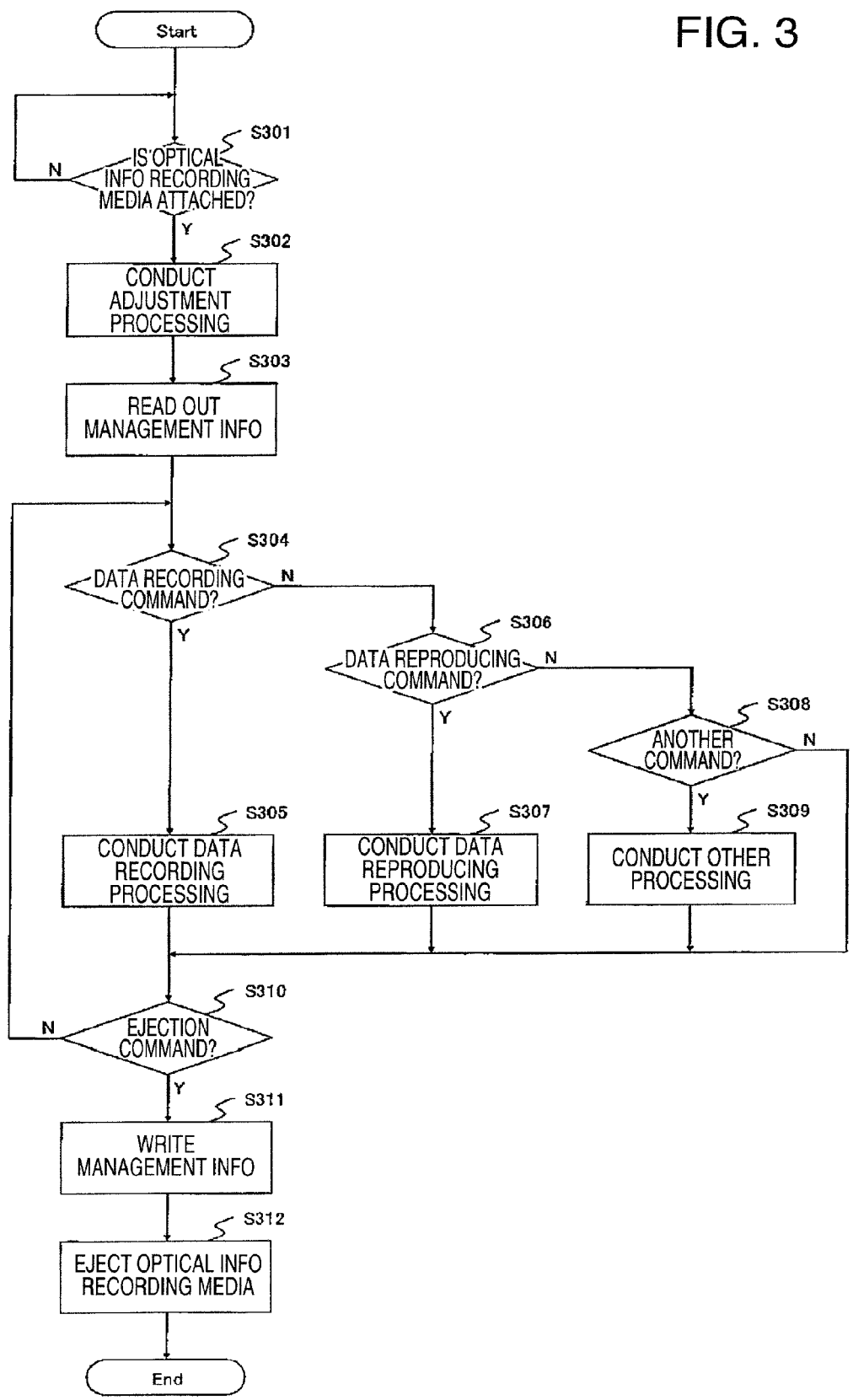
FIG. 3 is a flow chart for explaining operation of the optical information recording and reproducing apparatus in the first embodiment.

FIG. 3 is a flow chart showing operation of the optical information recording and reproducing apparatus in the first embodiment.

Upon attachment of the optical information recording media to the optical information recording and reproducing apparatus at step S301, adjustment processing is conducted at step S302 and management information is read out at step S303.

Upon receiving a data recording command from the external control apparatus at step S304, data recording processing is conducted at step S305. Or upon receiving a data reproducing command from the external apparatus at step S306, data reproducing processing is conducted at step S307. Or upon receiving another command from the external control apparatus at step S308, other processing is conducted at step S309.

Upon receiving an ejection command of the optical information recording media at step S310, management information is written on the optical information recording media at step S311. Alternation information is included in the management information. If there is data alternated due to a defect, a verify error or the like, alternation information is written there.

Then, the optical information recording media is ejected at step S312, and the processing is finished.

Figure 4:
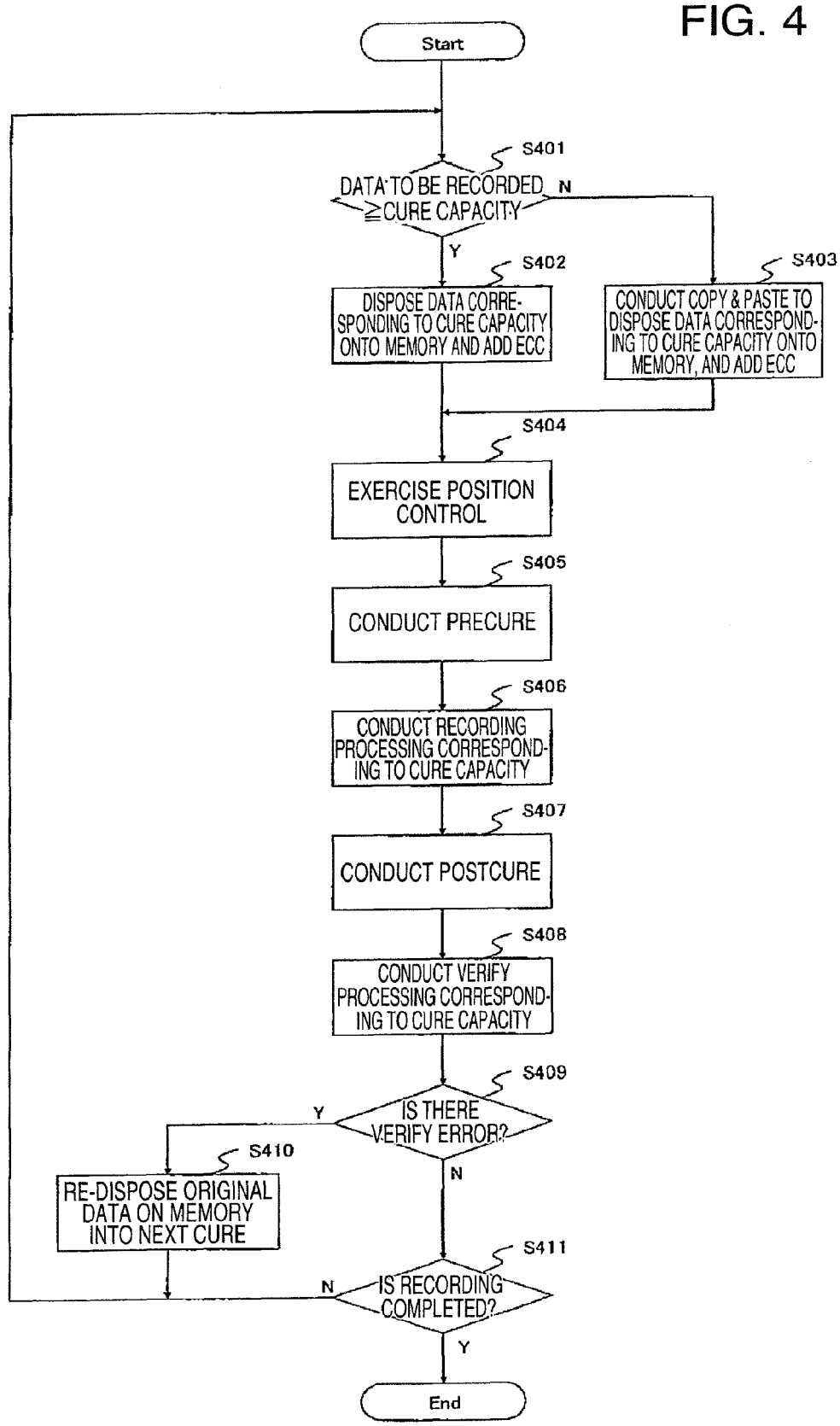
FIG. 4 is a flow chart for explaining recording processing operation in the optical information recording and reproducing apparatus in the first embodiment.

FIG. 4 is a flow chart showing operation of data recording processing in the optical information recording and reproducing apparatus in the first embodiment. By the way, it is supposed that the following flow operates in accordance with a command from the controller 112. The same holds true of subsequent flows as well.

First, at step S401, it is determined whether data to be recorded on the optical information recording media is at least the cure capacity. If the data to be recorded is at least the cure capacity, data corresponding to the cure capacity are disposed on the memory and an error correcting code ECC is added at step S402. By the way, data to be recorded on the optical information recording media is prepared in the memory beforehand.

If the data to be recorded on the optical information recording media is less than the cure capacity at the step S401, the data is disposed on the memory and the data is copied and pasted in an area left over to create data corresponding to the cure capacity and an error correcting code ECC is added at step S403. As a result, reliability of data is improved. By the way, the present invention is not restricted to this, but dummy data may be recorded in the area left over.

Then, at step S404, rotation control of the motor and position control of the pickup and the cure optical system are exercised and movement to a desired position is conducted in order to record data in a desired position of the optical information recording media.

Then, at step S405, precure is conducted. At step S406, data corresponding to the cure capacity is recorded on the optical information recording media. For example, supposing that there are 100 books in one cure and there are 300 pages in one book, 300 pages are recorded by angular multiplexing in a head book in the cure, 300 pages are recorded in the next book in the same way, and this is conducted for 100 books to record data in all books in the cure.

Then, at step S407, postcure is conducted. At step S408, verify processing of data corresponding to the cure capacity is conducted. As for the verify processing, a result is regarded as a verify error if an error correction impossibility or a CRC error has occurred by reproducing data from the optical information recording media. Or if a predetermined number of errors is exceeded even if an error correction impossibility does not occur, the result is regarded as a verify error. Or if non-coincidence occurs in comparison between data reproduced from the optical information recording media and the original data on the memory, the result is regarded as a verify error.

Then, at step S409, it is determined whether a verify error has occurred. If recorded data has caused a verify error, at step S410, original data on the memory is copied and data in the next cure on the memory is shifted backward, the copied data is pasted to the head of the next cure, re-disposition is conducted, and the processing returns to the step S401.

If a verify error does not occur at the step S409 and all recording is completed at step S411, the processing is finished. If all recording is not completed, however, the processing returns to the step S401.

If the data to be recorded on the optical information recording media is at least the cure capacity at the step S401, data corresponding to the cure capacity are disposed on the memory and an error correcting code ECC is added at step S402. At this time, data is disposed behind the place where data is disposed at the step S410.

If the data to be recorded on the optical information recording media is less than the cure capacity at the step S401, the data is disposed on the memory and the data is copied and pasted in an area left over to create data corresponding to the cure capacity and an error correcting code ECC is added at the step S403. At this time, data is disposed behind the place where data is disposed at the step S410.

Then, at step S404, rotation control of the motor and position control of the pickup and the cure optical system are conducted and movement to a desired position is conducted in order to record data in a desired position of the optical information recording media. Here, the desired position is, for example, the next position to an immediately recorded cure. Usually, the recording position is moved in order in the circumference direction or radial direction.

Then, at the step S405, precure is conducted. At the step S406, data corresponding to the cure capacity is recorded on the optical information recording media.

Then, at the step S407, postcure is conducted. At the step S408, verify processing of data corresponding to the cure capacity is conducted. At the step S409, it is determined whether a verify error has occurred. If recorded data has caused a verify error, the above-described operation is repeated. In the case where data to be recorded on the optical information recording media is less than the cure capacity and the data is recorded in an area left over by the copy and paste, it is judged that there is no verify error if one piece of data can be reproduced. Data that can be reproduced is registered in the management information as alternating data for the data that has caused a verify error.

If a verify error has not occurred, it is determined at the step S411 whether all data have been recorded. If there is data that is not yet recorded, the processing returns to the step S401 and the processing is continued. Unless there is data that is not yet recorded, the recording processing is finished.

Figure 5:
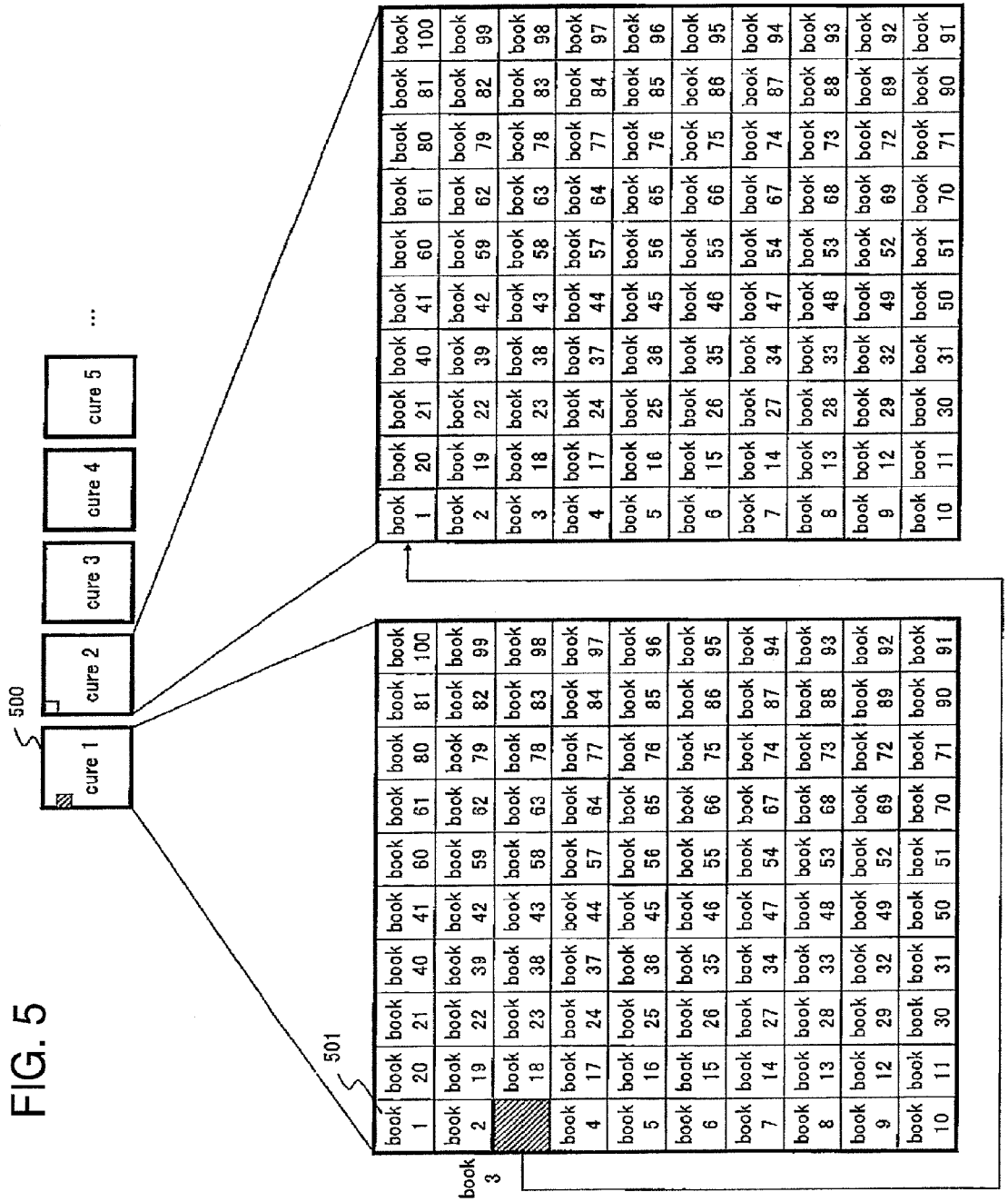
FIG. 5 is a diagram for explaining cures and books on optical information recording media in the first embodiment.

FIG. 5 is a diagram for explaining cures and books on the optical information recording media.

A cure 500 represents an area where precure and postcure are conducted once. A book 501 represents an area where recording and reproducing are conducted. Data are recorded in cure unit areas in order in the rotation direction and radial direction on the optical information recording media.

At the time of data recording, precure is first conducted in a cure unit area. Then, data are recorded in order by taking a book in the cure as the unit. For example, supposing that there are 100 books in each cure and there are 300 pages in each book, 300 pages are recorded in a certain book in a cure by angular multiplexing, 300 pages are recorded in the next book in the same way, and data are recorded in all books in the cure by conducting this for 100 books. Then, postcure is conducted, and verify processing of data in the cure is conducted.

For example, precure is conducted on cure 1, and data are recorded in book 1 to book 100 in the cure 1. Then, postcure is conducted on the cure 1 and verify processing on the cure 1 is conducted. It is now supposed that data recorded in book 3 in the cure 1 causes a verify error at this time.

In this case, the data recorded in the book 3 in the cure 1 is re-recorded in book 1 in cure 2 by retry.

And verify operation is conducted on the cure 2. For example, if the book 1 in the cure 2 has not caused a verify error, the book 1 is registered in a management area on the optical information recording media as alternating data. If the book 1 in the cure 2 has caused a verify error, the data recorded in the book 3 in the cure 1 is re-recorded in book 1 in cure 3.

A correspondence list between a defect address which has caused a verify error and an alternation destination address is recorded in the management area. The management area is provided, for example, on an inner circumference on the optical information recording media. A cure unit area in the management area may be made smaller than a cure unit area in a user data area.

Figure 14:
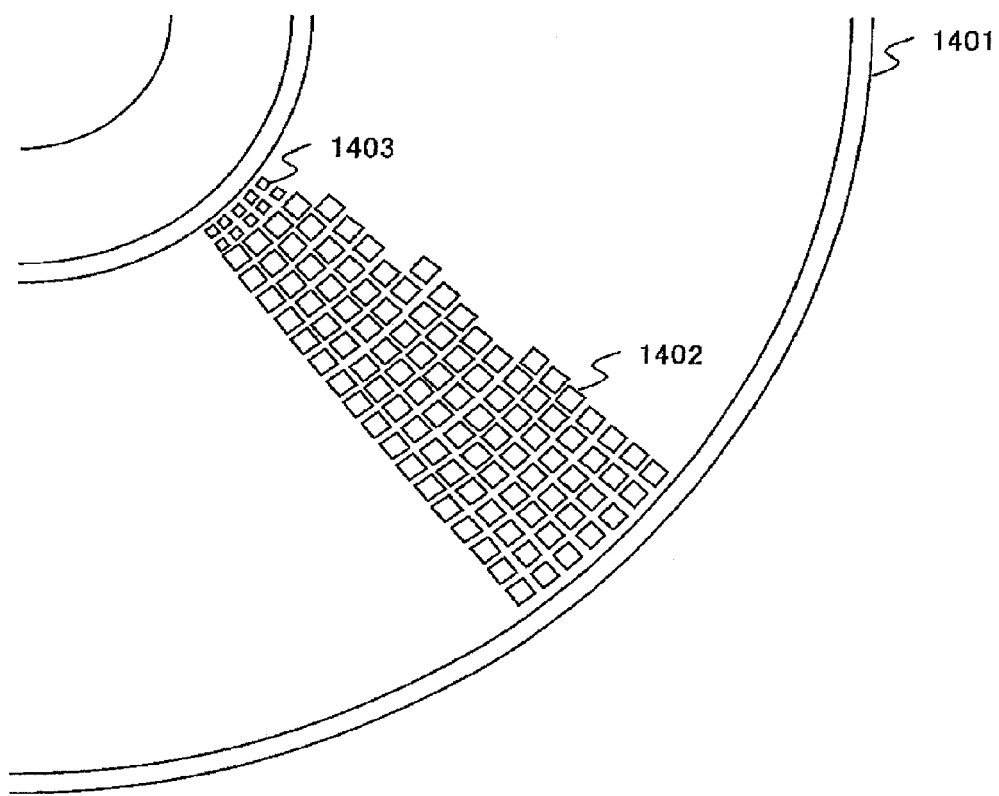
FIG. 14 is a diagram for explaining a management area on optical information recording media.

FIG. 14 shows an example of an arrangement configuration of the management area on the optical information recording media. Optical information recording media 1401 is disk-shaped recording media, and FIG. 14 shows a part thereof. A cure unit area 1402 in the user data area is a cure unit area for recording user data, and a cure unit area 1403 in the management area is a cure unit area for recording management information. The cure unit area 1403 in the management area is smaller than the cure unit area 1402 in the user data area, and is provided on an inner circumference. As a matter of course, the management area may be provided on an outer circumference. Owing to such a configuration, reliability of the data in the management information is improved. By the way, information can be recorded over the whole face of the optical information recording media 1401 by using holography. By the way, the present invention is not restricted to the configuration shown in FIG. 14. The correspondence list between a defect address which has caused a verify error and an alternation destination address may be recorded in the memory 106 or the like. Owing to such a configuration, efficiency of recording data on the optical information recording media is improved.

Figure 6:
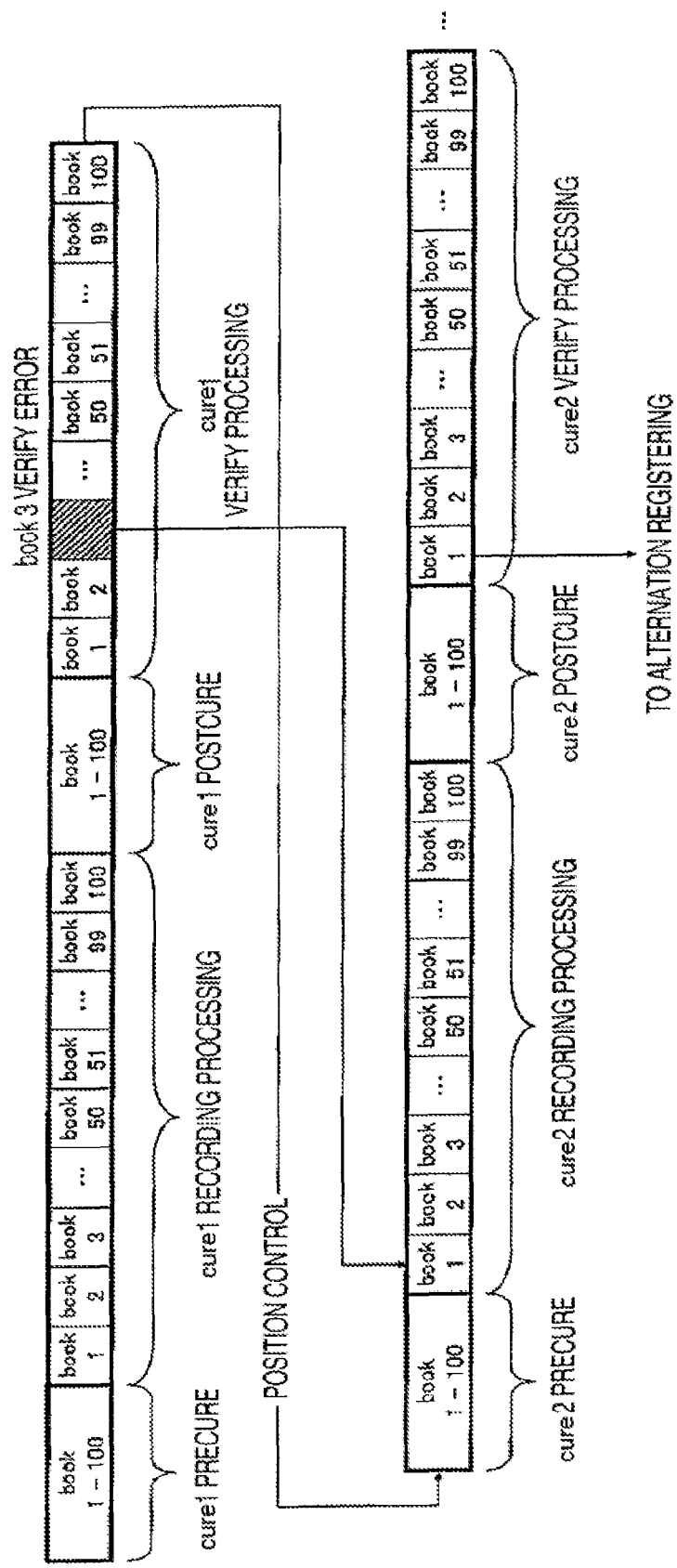
FIG. 6 is a timing chart showing operations of data recording processing and verify processing in the optical information recording and reproducing apparatus in the first embodiment.

FIG. 6 is a timing chart showing operations of data recording processing and verify processing in the optical information recording and reproducing apparatus.

Precure is conducted on the cure 1, and recording processing is conducted in order on book 1 to book 100 in the cure 1. Postcure is conducted on the cure 1, and then verify processing is conducted. A case where data recorded in book 3 in the cure 1 causes a verify error is shown.

Then, position control is exercised. Precure is conducted on the cure 2. When recording is conducted in order on book 1 to book 100 in the cure 2, data recorded in the book 3 in the cure 1 is re-recorded in the book 1 in the cure 2. Data that is to be recorded in the book 1 unless the verify error has not occurred is recorded in the book 2, and all successive data are recorded with a shift backward.

Then, postcure is conducted on the cure 2, and verify processing is conducted. Unless the book 1 in the cure 2 causes a verify error, the book 1 is registered as alternating data.

Figure 7:
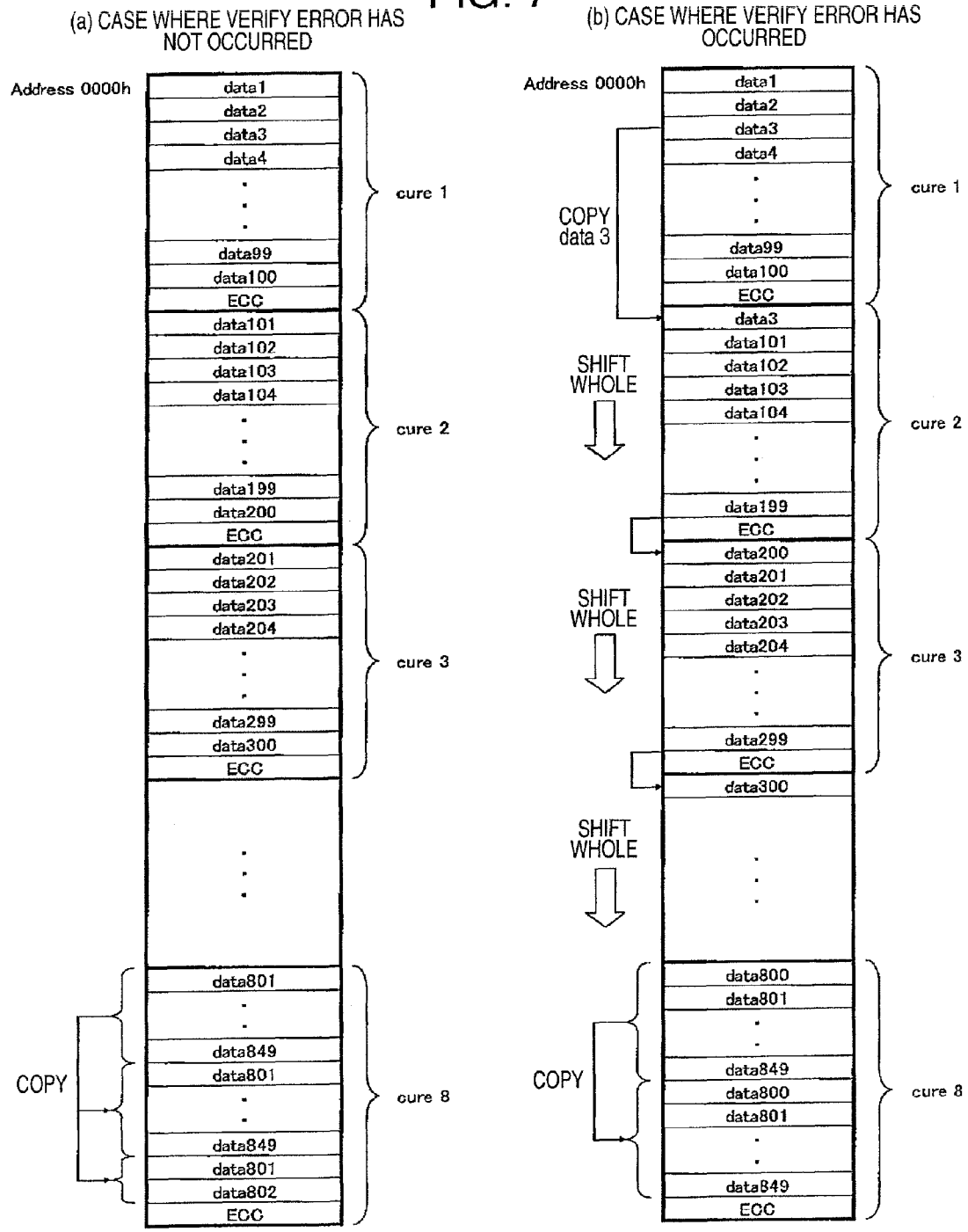
FIG. 7 is a memory map in the optical information recording and reproducing apparatus in the first embodiment.

FIG. 7 shows a portion of a memory map for the optical information recording and reproducing apparatus in the first embodiment. FIG. 7(a) shows an example of a case where a verify error has not occurred, and FIG. 7(b) shows an example of a case where a verify error has occurred.

In FIG. 7(a), data 1 to data 100 are disposed in cure 1, data 101 to data 200 are disposed in cure 2, and data 201 to data 300 are disposed in cure 3. Although not illustrated, subsequent data are disposed as far as cure 7 in the same way. Data 801 to data 849 are disposed in cure 8. Data to be recorded are data 1 to data 849, and data 849 is end of data. In the cure 8, recorded data are less than the cure capacity. Therefore, data 801 to data 849 are disposed again. In addition, data 801 and data 802 are disposed in a fraction portion as well. Respective data correspond to books. Data are modulated in this order and recorded on the optical information recording media.

FIG. 7(b) shows an example in which data 3 included in data 1 to data 100 disposed in cure 1 causes a verify error and the data 3 is disposed again at head of cure 2. Since the data 3 is disposed again at the head of the cure 2, subsequent arrangement shifts by one book. Data 101 to data 199 are disposed in the cure 2, data 200 to data 299 are disposed in cure 3, and ECCs are added. Although not illustrated, subsequent data are disposed as far as cure 7 in the same way. Data 801 to data 849 are disposed in cure 8. In the cure 8, recorded data are less than the cure capacity. Therefore, data 800 to data 849 are disposed again.

Even in a case where, for example, data 801 has become a verify error, therefore, it is not necessary to create retry data for the data 801 if the copied data 801 is not a verify error. As a result, the recording efficiency can be improved.

A coping example in a case where a verify error is detected in data in the last cure unit area (for example, cure 8 in FIG. 7) of recording data will now be described.

In this case, the capacity of multiple recording in the same place is large. Therefore, a problem that a waste is large in a case where data to be recorded is small in amount is conceivable.

As for a technique for solving this problem, for example, JP-A-2009-301627 can be mentioned. JP-A-2009-301627 describes "even if data corresponding to a fraction which is less than a book in capacity occurs in data to be recorded in multiplex for the same volume in holographic recording at the time of end of recording, the data corresponding to the fraction can be recorded not on holographic recording media but in an auxiliary recording apparatus in a recording apparatus. When conducting incremental recording, the data corresponding to the fraction is read out from the auxiliary recording apparatus, connected to input data to be incrementally recorded, and recorded. Therefore, it becomes possible to conduct incremental recording of data on holographic recording media without waste."

On the other hand, for example, as described with reference to the step S403 in FIG. 4, data is disposed on a memory, the data is copied and pasted in an area left over to create data corresponding to the cure capacity, and an error correcting code ECC is added. As a result, reliability of data is improved.

Furthermore, if a verify error occurs in a final cure unit area of recording data, only retry data is recorded in the next cure to be recorded and consequently the next cure unit area to be recorded may be made small. For example, if the next cure unit area is made as small as ¼, ⅑ or the like as compared with the ordinary cure and recording is conducted, the next data can be recorded in a remaining area corresponding to ¾ or ⅚ without waste. Or recording may be conducted in a small cure unit area in an inner circumference, an outer circumference or the like of the optical information recording media. Furthermore, it is also possible to use a configuration in which a predetermined threshold is provided and in a case where the retry data to be recorded subsequently is equal to the predetermined threshold or less the cure unit area to be recorded is made small.

Furthermore, it is also possible to make the next cure unit area as small as ¼. ⅑ or the like as compared with the ordinary cure and in addition copy and paste the data for a deficiency of the cure capacity to create data corresponding to the cure capacity. As a result, it is possible to attempt to improve the reliability of data and the recording efficiency.

By the way, in the above-described shift, each data is copied and pasted on the memory and moved. Alternatively, however, reading and writing may be conducted by shifting the address without actually moving data.

Figure 15:
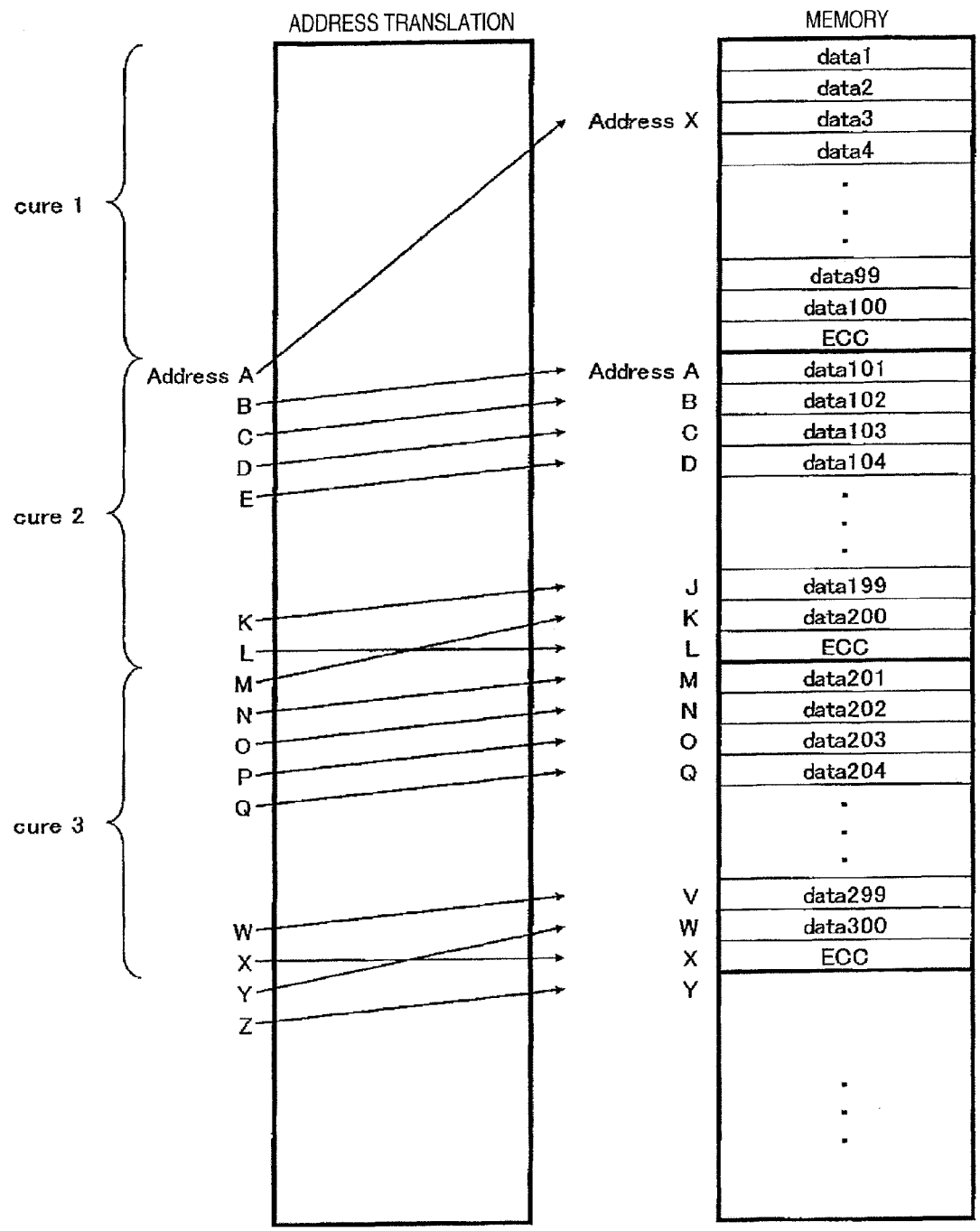
FIG. 15 is a memory map in the optical information and recording apparatus in the first embodiment.

FIG. 15 shows an example in which alternating data is caused to cut in by conducting address translation to the memory in the memory control circuit without moving data on the memory.

FIG. 15 shows an example in which data 1 to data 100 are recorded in cure 1, data 3 among them causes a verify error, and the data 3 is recorded again at the head of cure 2, in the same way as FIG. 7. Supposing that addresses of data 101, data 102, data 103, . . . in the cure 2 on the memory are A, B, C, and an address of the data 3 in the cure 1 is X, the memory control circuit transforms the address A to the address X, and transforms the addresses B, C, D, E, . . . to addresses A, B, C, D, . . . respectively. As a result, the data 3 is recorded at the head of the cure 2 on the optical information recording media, and subsequently the data 101, data 101, . . . are recorded. The ECC is recorded at the end or the like of the cure 2 as it is without being subjected to address translation.

If address translation is conducted as described heretofore, it is not necessary to actually copy and paste data on the memory to move the data.

Furthermore, in the present embodiment, an example in which data is alternated with a book taken as the unit is described for intelligibility. However, it is not necessary that especially a book is the unit.

Furthermore, in the present embodiment, an example in which an error correction code is added with a cure taken as the unit is described for intelligibility. However, it is not necessary that especially a cure is the unit.

Furthermore, in the present embodiment, an example in which the optical information recording and reproducing apparatus conducts error correction processing and retry data creation is described. However, the external control apparatus may conduct the error correction processing and retry data creation.

Furthermore, there is a possibility that books disposed around a book that has caused a verify error will be low in reliability and there is a fear that the books disposed around the book will become uncorrectable in error in the future. Therefore, retry data may be created not only for the book but also for books disposed around the book in four directions or books disposed around the book in eight directions to conduct alternation.

According to the first embodiment of the present invention described heretofore, it becomes possible to conduct the verify processing efficiently.

Furthermore, if recorded data has caused a verify error, the data is caused to cut in at the head of the next cure unit and recorded by retry. As a result, it is avoided that retry is conducted with only the data that has caused a verify error occupying a cure. The data is caused to cut in at the head of the next cure unit and recording is conducted. Accordingly, consumption of a recording area on the optical information recording media can be suppressed.

Furthermore, according to the present embodiment, a cure unit area where retry data exists and a cure unit area where data for which a verify error has been detected exists are adjacent to each other, the access performance to the retry data is improved.

Furthermore, in the first embodiment of the present invention having the configuration described heretofore, if data to be recorded on the optical information recording media is less than the cure capacity, the data is copied and pasted in an area left over to record data corresponding to the cure capacity, and if original data has caused a verify error, copy data is registered alternatively. The data is recorded in the same cure a plurality of times. Even if some data has caused a verify error, therefore, different data can be registered alternatively.

By the way, in the present embodiment, an example in which data that has caused a verify error is caused to cut in at the head of the next cure unit and recorded has been described. However, the present invention is not restricted to this. For example, the data may be caused to cut in at the end of the next cure unit and recorded, or the data may be caused to cut in in any other place.

Embodiment 2

Figure 8:
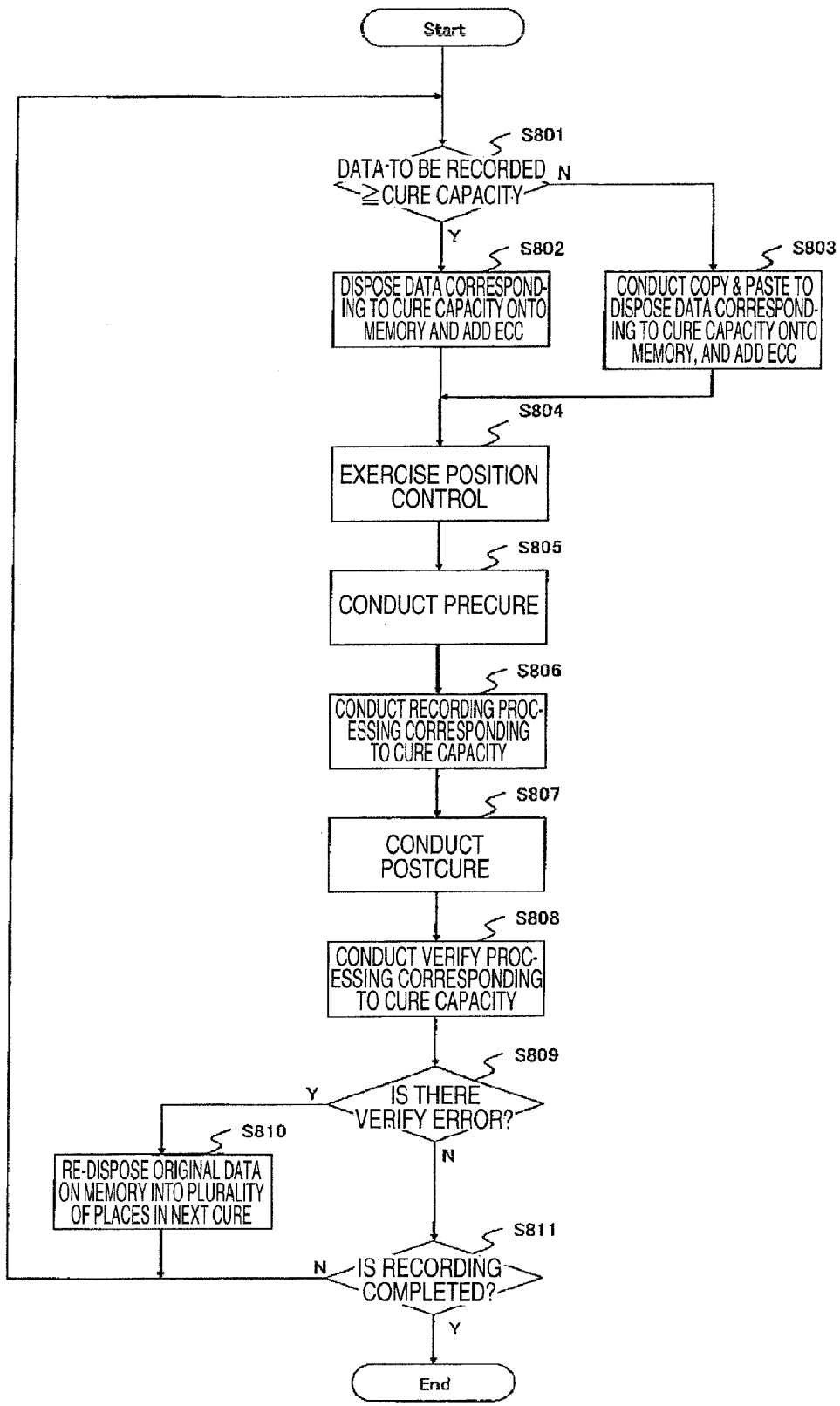
FIG. 8 is a flow chart showing operation of data recording processing in an optical information and recording apparatus in a second embodiment.

Embodiment 2 will now be described. Since a configuration of an optical information recording and reproducing apparatus is similar to that in embodiment 1, description thereof will be omitted. FIG. 8 is a flow chart showing an operation of data recording processing in the optical information recording and reproducing apparatus in the second embodiment. Steps S801 to 809 are similar to the steps S401 to 409 in FIG. 4, and consequently description thereof will be omitted.

At step S809, it is determined whether a verify error has occurred. If recorded data has caused a verify error, at step S810, original data on the memory is copied and the copied data is pasted in a plurality of places in the next cure on the memory. At the same time, data in the next cure is shifted backward by the amount of the paste. Thereby, the data is disposed in a plurality of places in the cure, and the processing returns to the step S801. For example, it is supposed that the data is recorded in three places and the data in two places cause a verify error again. If the data in one place can be reproduced, it becomes possible to register the data as alternating data.

If a verify error does not occur at the step S809 and all recording is completed at step S811, the processing is finished. Unless all recording is completed, however, the processing returns to the step S801.

Furthermore, at the step S809, it is determined whether a verify error has occurred. If recorded data has caused a verify error, the above-described operation is repeated. As for data that has caused a verify error once, the data is recorded in a plurality of places in the cure. If data in one place can be reproduced, therefore, the data is regarded as data having no verify error. Also in the case where data to be recorded on the optical information recording media is less than the cure capacity and the data is copied and pasted in an area left over to record data corresponding to the cure capacity, the data is regarded as data having no verify error if data in one place can be reproduced. The data that can be reproduced is registered in the management information as alternating data for the data that has caused a verify error.

If a verify error has not occurred, it is determined at the step S811 whether all data have been recorded. If there is data that is not yet recorded, the processing returns to the step S801 and the processing is continued. Unless there is data that is not yet recorded, the recording processing is finished.

Figure 9:
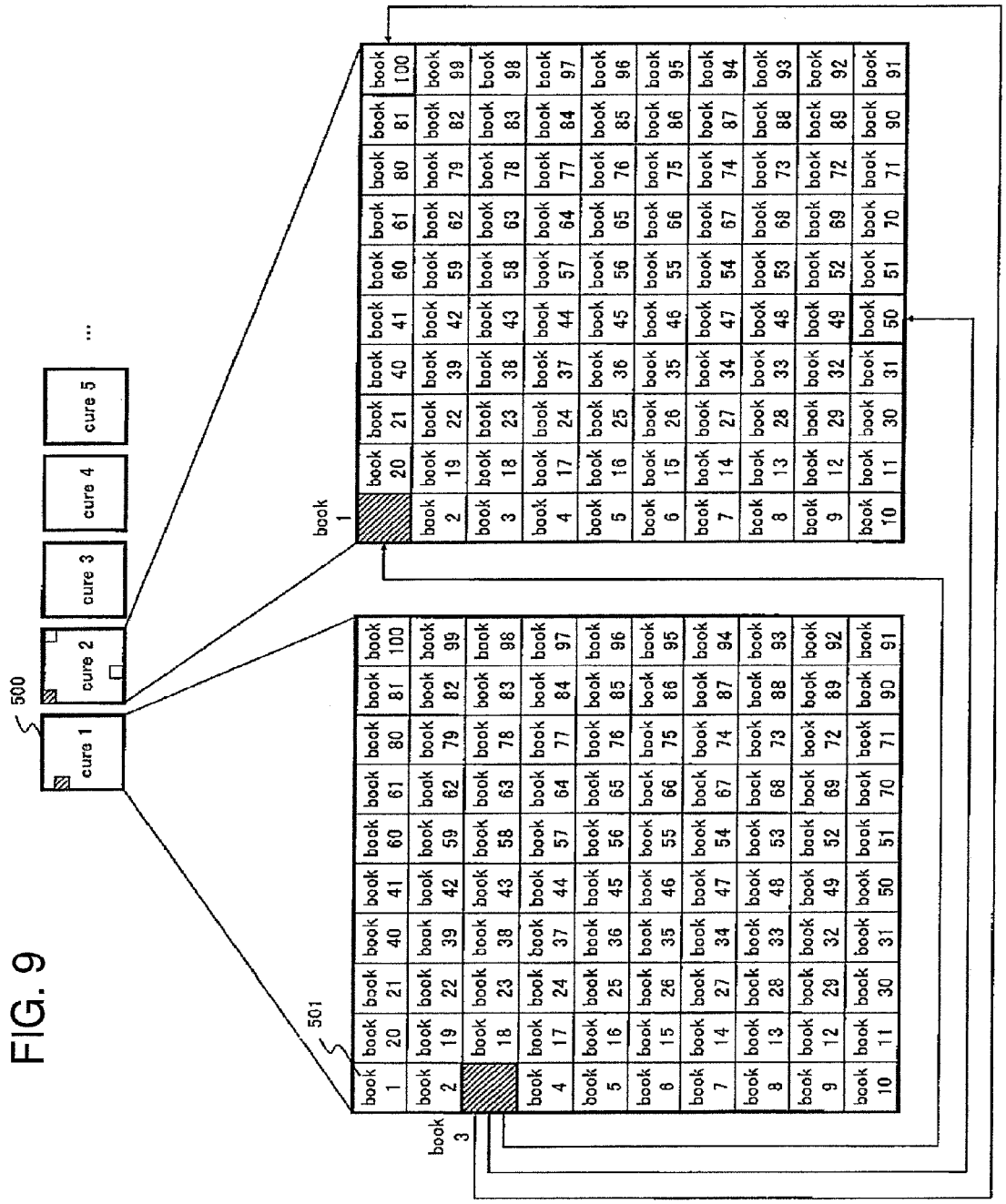
FIG. 9 is a diagram for explaining cures and books on optical information recording media in the second embodiment.

FIG. 9 is a diagram for explaining cures and books on the optical information recording media.

A cure 500 represents an area where precure and postcure are conducted once. A book 501 represents an area where recording and reproducing are conducted. Data are recorded in cure unit areas in order in the rotation direction and radial direction on the optical information recording media.

At the time of data recording, precure is first conducted in a cure unit area. Then, data are recorded in order by taking a book in the cure as the unit. Then, postcure is conducted, and verify processing of data in the cure is conducted.

For example, precure is conducted on cure 1, and data are recorded in book 1 to book 100 in the cure 1. Then, postcure is conducted on the cure 1 and verify processing on the cure 1 is conducted. It is now supposed that data recorded in book 3 in the cure 1 causes a verify error at this time.

In this case, the data recorded in the book 3 in the cure 1 is re-recorded in book 1, book 50, and book 100 in cure 2.

And verify operation is conducted on the cure 2. For example, if the book 1 in the cure 2 has caused a verify error again and the book 50 and the book 100 have not caused a verify error, the book 50 is registered as alternating data.

Since data which has caused a verify error is recorded in a plurality of places, the probability that all of the data will cause a verify error can be reduced. Furthermore, when a certain book on the optical information recording media is defective, it is considered that peripheral books are also influenced. If the data is recorded in a plurality of places apart from each other in this way, therefore, the probability that all data in the places will cause a verify error can be further reduced. If all data in the places cause a verify error, the data is re-recorded in book 1 in cure 3.

Figure 10:
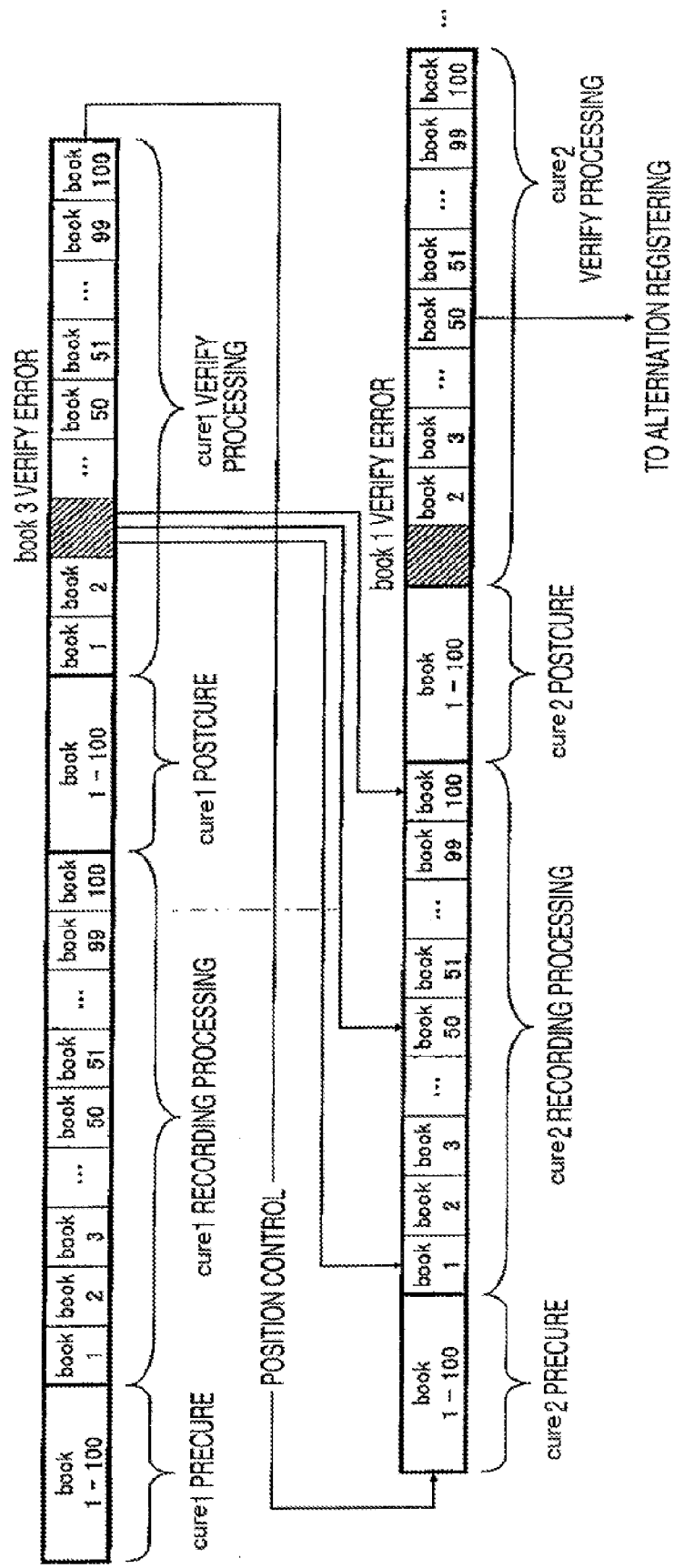
FIG. 10 is a timing chart showing operations of data recording processing and verify processing in the optical information recording and reproducing apparatus in the second embodiment.

FIG. 10 is a timing chart showing operations of data recording processing and verify processing on the optical information recording media.

Precure is conducted on the cure 1, and recording processing is conducted in order on book 1 to book 100 in the cure 1. Postcure is conducted on the cure 1, and then verify processing is conducted. A case where data recorded in book 3 in the cure 1 causes a verify error is shown.

Then, position control is exercised. Precure is conducted on the cure 2. When recording is conducted in order on book 1 to book 100 in the cure 2, data recorded in the book 3 in the cure 1 is re-recorded in the book 1, book 50, and book 100 in the cure 2. Data that is to be recorded in the book 1 unless the verify error has not occurred is recorded in the book 2, and all successive data are recorded with a shift backward. Data that is to be recorded in the book 50 unless the verify error has not occurred is recorded in the book 52.

Then, postcure is conducted on the cure 2, and verify processing is conducted. It is shown that the book 50 is registered as alternating data if the book 1 in the cure 2 causes a verify error and the book 50 and the book 100 in the cure 2 do not cause a verify error.

Furthermore, in the present embodiment, an example in which data is alternated with a book taken as the unit is described for intelligibility. However, it is not necessary that especially a book is the unit.

Furthermore, in the present embodiment, an example in which an error correction code is added with a cure taken as the unit is described for intelligibility. However, it is not necessary that especially a cure is the unit.

Owing to the configuration described heretofore, in the second embodiment of the present invention, effects similar to those in the embodiment 1 can be obtained.

It is now supposed, for example, that the error occurrence probability of optical information recording media is high. If certain data has repeated a verify error, there is a possibility in the first embodiment that alternation will not be completed over several cures. Over the time, the memory is occupied. In the second embodiment, data is recorded in a plurality of places in the same cure. Therefore, the probability that alternation will be completed in the next cure to a cure where a verify error has occurred first becomes high and it can be avoided that the data occupies the memory for an indefinite time.

Embodiment 3

Figure 11:
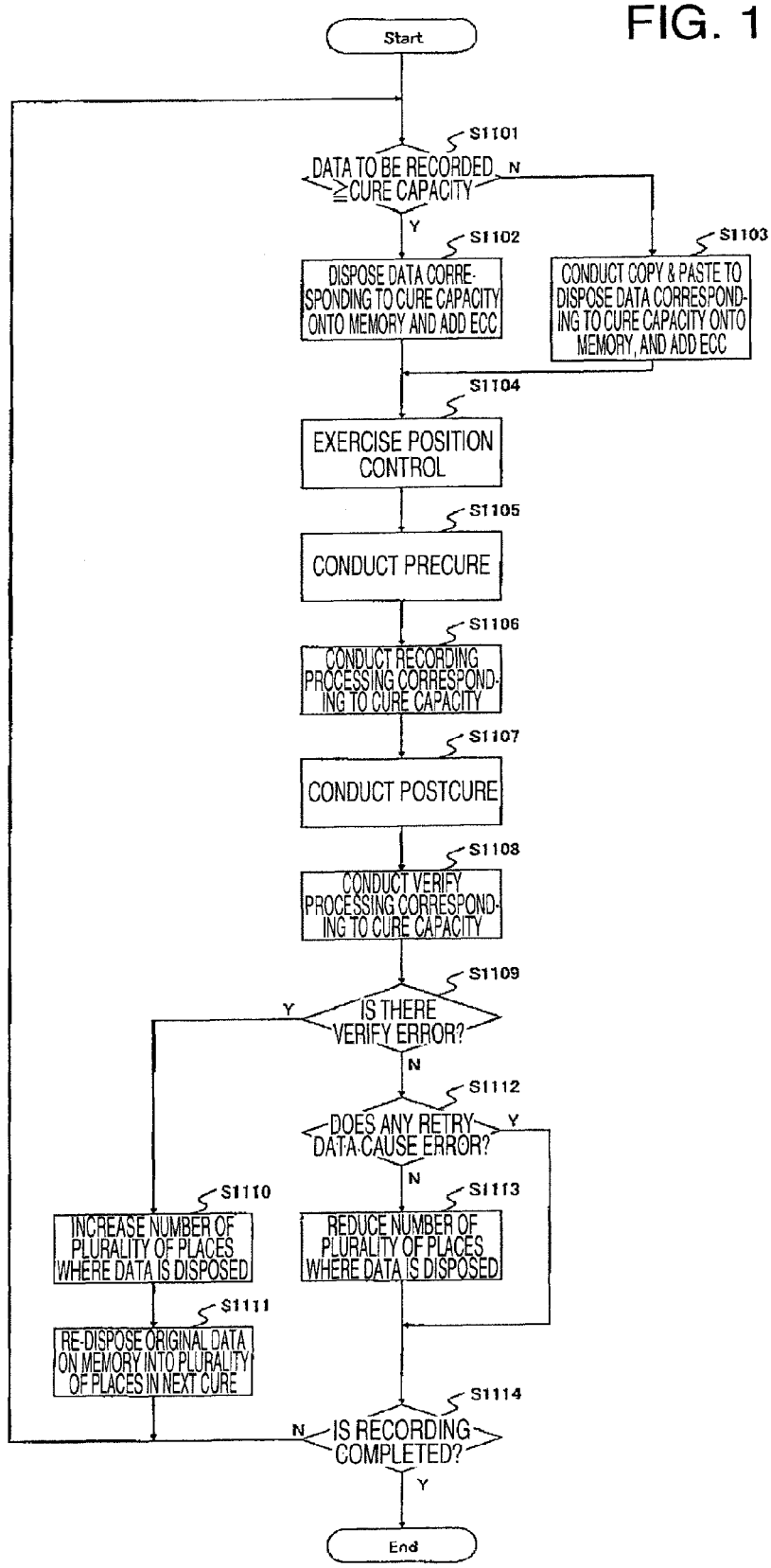
FIG. 11 is a flow chart showing operation of data recording processing in an optical information and recording apparatus in a third embodiment.

Embodiment 3 will now be described. Since a configuration of an optical information recording and reproducing apparatus is similar to that in embodiment 1, description thereof will be omitted. FIG. 11 is a flow chart showing an operation of data recording processing in the optical information recording and reproducing apparatus in the third embodiment. Steps S1101 to 1109 are similar to the steps S401 to 409 in FIG. 4, and consequently description thereof will be omitted.

At step S1109, it is determined whether a verify error has occurred. If recorded data has caused a verify error, at step S1111, original data on the memory is copied and the copied data is pasted in a plurality of places in the next cure on the memory. Thereby, the data is disposed in a plurality of places in the cure, and the processing returns to the step S1101. For example, the data is recorded in three places. As long as data in one place can be reproduced even if data in two places cause a verify error again, it becomes possible to register the data as alternating data.

By the way, before the data is disposed in a plurality of places in the cure at the step S1111, the number of places where the data is to be recorded is adjusted at step S1110. This will be described later.

If a verify error does not occur at the step S1109 and all recording is completed at step S1114, the processing is finished. Unless all recording is completed, however, the processing returns to the step S1101.

By the way, before it is determined at the step S1114 whether all recording is completed, the number of places where the data is to be recorded when a verify error is detected is adjusted at step S1112 and step S1113. This will also be described later.

Furthermore, at the step S1109, it is determined whether a verify error has occurred. If recorded data has caused a verify error, the above-described operation is repeated. As for data that has caused a verify error once, the data is recorded in a plurality places in the cure. If data in one place can be reproduced, therefore, the data is regarded as data having no verify error. Also in the case where data to be recorded on the optical information recording media is less than the cure capacity and the data is copied and pasted in an area left over to record data corresponding to the cure capacity, the data is regarded as data having no verify error if data in one place can be reproduced. The data that can be reproduced is registered in the management information as alternating data for the data that has caused a verify error.

If a verify error has not occurred at the step S1109, it is determined at the step S1112 whether all retry data are errorless, i.e., all data can be reproduced. If all retry data are errorless, the number of a plurality of places where data is recorded when an error has occurred is reduced at the step S1113. If the number of places becomes one or less, however, the number is set equal to 1. Or the minimum number of places may be predetermined.

Then, at the step S1114, it is determined whether all data have been recorded. If there is data that is not yet recorded, the processing returns to the step S1101 and the processing is continued. Unless there is data that is not yet recorded, the recording processing is finished.

If a verify error has occurred at the step S1109, it is meant that all retry data are erroneous, i.e., retry is needed again, and the number of places where data is recorded when an error has occurred is increased at the step S1110. However, the number of places is set not to exceed a predetermined maximum number.

Then, at the step S1111, the data is copied and the copied data is pasted in a plurality of places in the cure on the memory. Thereby, the data is disposed in a plurality of places in the cure. The processing returns to the step S1101, and the processing is continued.

Owing to the configuration described heretofore, in the third embodiment of the present invention, effects similar to those in the embodiment 2 can be obtained.

In addition, the third embodiment has a function of automatically changing over the number of places where data is recorded, according to the error occurrence probability of the optical information recording media. Accordingly, it is possible to exercise control to prevent the recording capacity of the optical information recording media from reducing more than needed. As compared with the second embodiment, therefore, it is possible to suppress consumption of the recording area of the optical information recording media.

Embodiment 4

Figure 12:
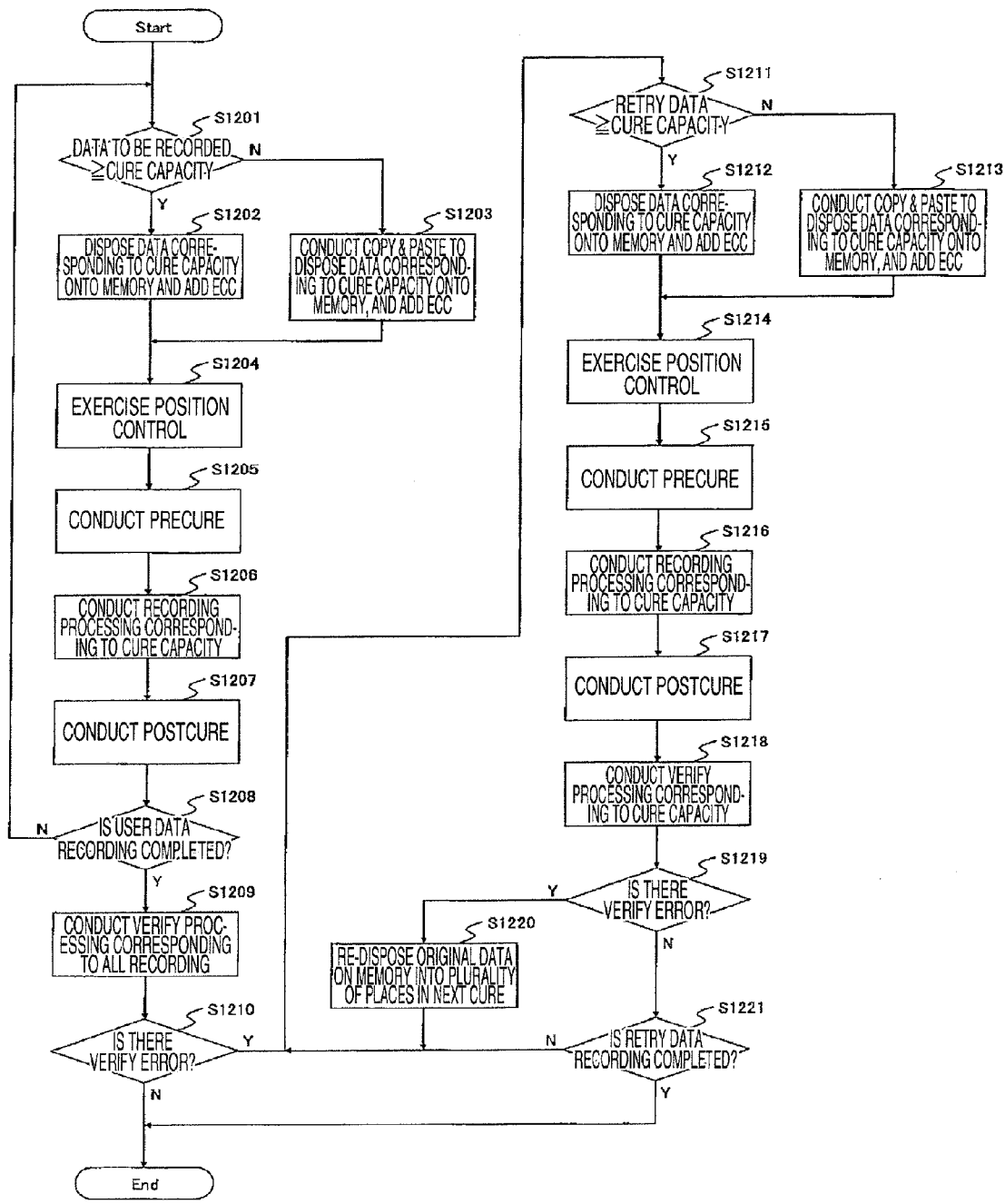
FIG. 12 is a flow chart showing operation of data recording processing in an optical information and recording apparatus in a fourth embodiment.

Embodiment 4 will now be described. Since a configuration of an optical information recording and reproducing apparatus is similar to that in embodiment 1, description thereof will be omitted. FIG. 12 is a flow chart showing an operation of data recording processing in the optical information recording and reproducing apparatus in the fourth embodiment of the present invention. Steps S1201 to 1207 are similar to the steps S401 to 407 in FIG. 4, and consequently description thereof will be omitted.

At step S1207, postcure is conducted. At step 1208, it is determined whether recording of user data is completed. If recording is not completed, the processing returns to step S1201. Until recording is completed, processing of the step S1201 to the step S1208 is repeated.

By the way, in the present embodiment, all data are recorded once and then verify processing is conducted. Therefore, the data is referred to as user data, and data recorded by subsequent retry is referred to as retry data.

If recording is completed, verify processing is conducted for all recorded data at step S1209 and it is determined at step S1210 whether a verify error has occurred.

Unless recorded user data cause a verify error, the processing is finished. If recorded user data cause a verify error, it is determined at step S1211 whether retry data to be recorded on the optical information recording media is at least the cure capacity. If retry data to be recorded on the optical information recording media is at least the cure capacity, retry data corresponding to the cure capacity are disposed on the memory and an error correcting code ECC is added.

If the data to be recorded on the optical information recording media is less than the cure capacity at the step S1211, the retry data is disposed on the memory and the retry data is copied and pasted in an area left over to create data corresponding to the cure capacity and an error correcting code ECC is added at step S1213.

Then, at step S1214, position control of the pickup and the cure optical system is conducted and movement to a desired position is conducted in order to record retry data in a desired position of the optical information recording media.

Then, at the step S1215, precure is conducted. At step S1216, retry data corresponding to the cure capacity is recorded on the optical information recording media.

Then, at step S1217, postcure is conducted. At step S1218, verify processing of retry data corresponding to the cure capacity is conducted.

Then, at step S1219, it is determined whether a verify error has occurred. Unless recorded retry data cause a verify error, it is determined at step S1221 whether recording is completed. Unless recording is completed, the processing returns to step S1211 and the processing at the step S1211 to the step S1221 is repeated until the recording is completed.

If the recorded retry data causes a verify error at the step S1219, original data on the memory is copied and pasted in a plurality of places in the next cure on the memory to dispose the data in the plurality of places in the cure at step S1220 and the processing returns to the step S1210. By the way, the original data may be pasted not in a plurality of places but in one place.

Owing to the configuration described heretofore, in the fourth embodiment of the present invention, efficient verify processing becomes possible.

Furthermore, if recorded user data causes a verify error, the data is accumulated as retry data in a retry cure previously prepared on the memory. When recording of user data is finished, the retry data are re-recorded collectively. For this purpose, it is possible to prepare an alternating area on, for example, an inner circumference or an outer circumference and record the retry data in the alternating area.

By the way, if retry data to be re-recorded is less than the cure capacity, one cure capacity may be obtained by copy and paste and recorded.

Furthermore, if data is less than the cure capacity in the final cure unit area of user data to be recorded, retry data accumulated on the memory may be recorded in a portion left over. As a result, the recording efficiency can be further improved.

Embodiment 5

Figure 13:
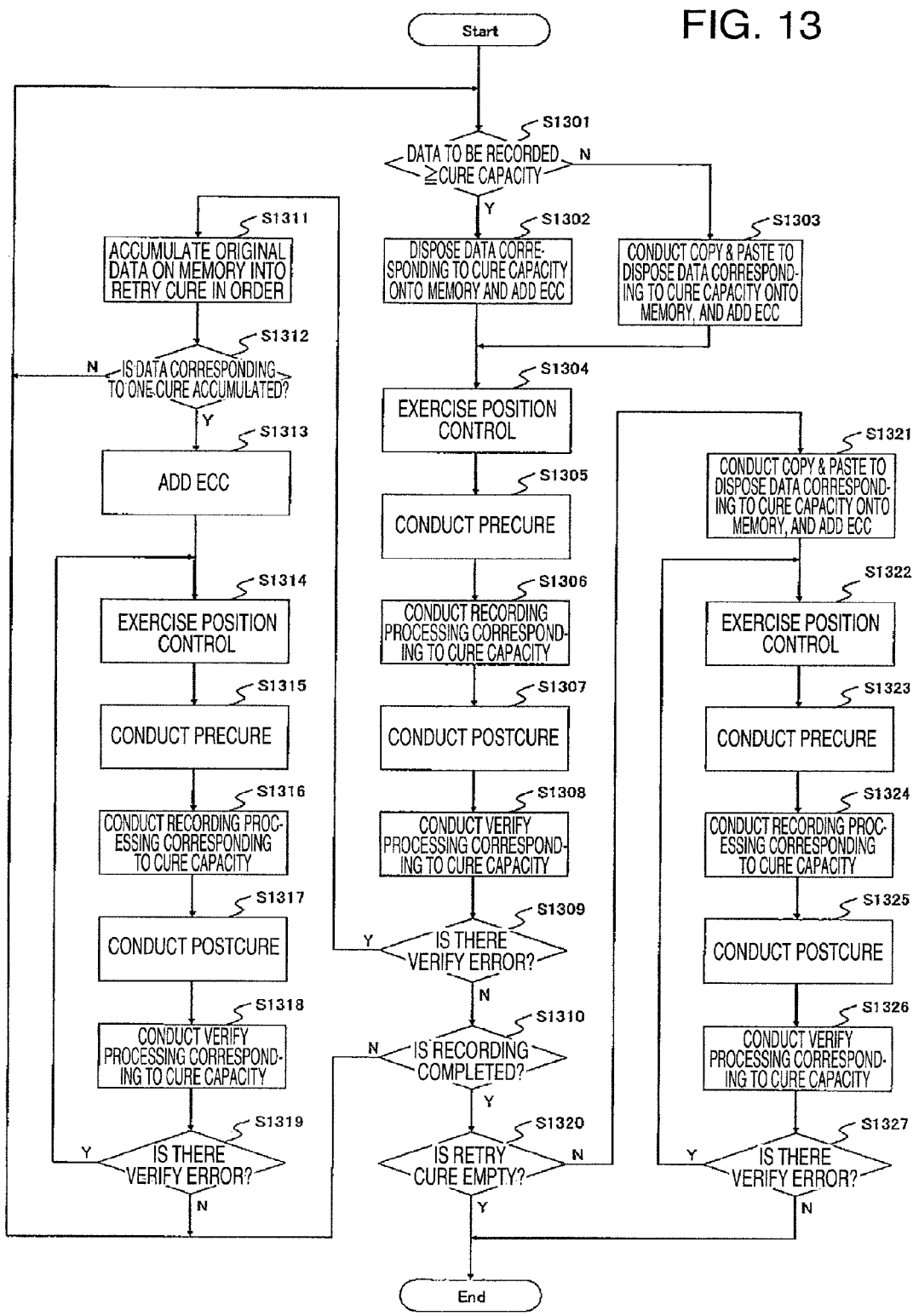
FIG. 13 is a flow chart showing operation of data recording processing in an optical information and recording apparatus in a fifth embodiment.

Embodiment 5 will now be described. A configuration of an optical information recording and reproducing apparatus is similar to that in the embodiment 1, and consequently description thereof will be omitted. FIG. 13 is a flow chart showing an operation of data recording processing in the optical information recording and reproducing apparatus in the fifth embodiment of the present invention.

First, at step S1301, it is determined whether data to be recorded on the optical information recording media is at least the cure capacity. If the data to be recorded is at least the cure capacity, data corresponding to the cure capacity are disposed on the memory and an error correcting code ECC is added at step S1302. By the way, data to be recorded on the optical information recording media is prepared in the memory beforehand.

If the data to be recorded on the optical information recording media is less than the cure capacity at the step S1301, the data is disposed on the memory and the data is copied and pasted in an area left over to create data corresponding to the cure capacity and an error correcting code ECC is added at step S1303.

Then, at step S1304, position control of the pickup and the cure optical system is conducted and movement to a desired position is conducted in order to record data in a desired position of the optical information recording media.

Then, at step S1305, precure is conducted. At step S1306, data corresponding to the cure capacity is recorded on the optical information recording media.

Then, at step S1307, postcure is conducted. At step S1308, verify processing of data corresponding to the cure capacity is conducted.

Then, at step S1309, it is determined whether a verify error has occurred. Unless recorded data causes a verify error, it is determined at step S1310 whether recording is completed. Unless recording is completed, the processing returns to the step S1301 and the processing at the step S1301 to the step S1310 is repeated until the recording is completed.

If recorded data causes a verify error at the step S1309, original data on the memory are copied and pasted in order in a retry cure previously prepared on the memory at step S1311.

Then at step S1312, it is determined whether data corresponding to one cure are accumulated in the retry cure. Unless data corresponding to one cure is accumulated, the processing returns to step S1301 and the processing at the step S1301 to the step S1310 is repeated.

If data corresponding to one cure is accumulated, an error correcting code ECC is added at step S1313.

Then, at step S1314, position control of the pickup and the cure optical system is conducted and movement to a desired position is conducted in order to record data in a desired position of the optical information recording media.

Then, at step S1315, precure is conducted. At step S1316, data corresponding to the cure capacity is recorded on the optical information recording media.

Then, at step S1317, postcure is conducted. At step S1318, verify processing of data corresponding to the cure capacity is conducted.

Then, at step S1319, it is determined whether a verify error has occurred. If recorded data has caused a verify error, the processing returns to the step S1314 and the processing at the step S1314 to the step S1319 is repeated until a verify error disappears.

Unless the recorded data causes a verify error, the processing returns to the step S1301 and the processing at the step S1301 to the step S1310 is repeated.

At the step S1310, it is determined whether recording of the user data is completed. If the recording is completed, it is determined at step S1320 whether the retry cure on the memory is empty. If the retry cure is empty, i.e., there are no retry data to be recorded, the processing is finished. Unless the retry cure is empty, i.e., if there is retry data to be recorded, the retry data is copied and pasted to obtain one cure and an error correcting code ECC is added at step S1321.

Then, at step S1322, position control of the pickup and the cure optical system is conducted and movement to a desired position is conducted in order to record data in a desired position of the optical information recording media. Then, at step S1323, precure is conducted. At step S1324, data corresponding to the cure capacity is recorded on the optical information recording media.

Then, at step S1325, postcure is conducted. At step S1328, verify processing of data corresponding to the cure capacity is conducted.

Then, at step S1327, it is determined whether a verify error has occurred. Unless the recorded data causes a verify error, the processing is finished. If recorded data has caused a verify error, the processing returns to the step S1322 and the processing at the step S1322 to the step S1327 is repeated until a verify error disappears.

The fifth embodiment according to the present invention has the configuration described heretofore. If data to be recorded on the optical information recording media is less than the cure capacity, the data is copied and pasted in an area left over to record data corresponding to the cure capacity. If original data has caused a verify error, copied data is registered alternatively. Data is recorded in a plurality of places in the same cure. Even if data in one place causes a verify error, data in another place can be registered alternatively.

Furthermore, if recorded user data has caused a verify error, the data is accumulated as retry data in the retry cure previously prepared on the memory. At the time when data corresponding to one cure capacity have been accumulated, the data are re-recorded collectively. For this purpose, the alternating area is prepared in, for example an inner circumference or an outer circumference, and the data can be recorded in the alternating area.

By the way, if data to be re-recorded is less than the cure capacity, one cure capacity is obtained by copy and paste and recording is conducted.

In addition, since re-recording is conducted at the time when data corresponding to one cure capacity is accumulated, the occupied area on the memory can be reduced as compared with the fourth embodiment of the present invention.

Embodiment 6

Figure 16:
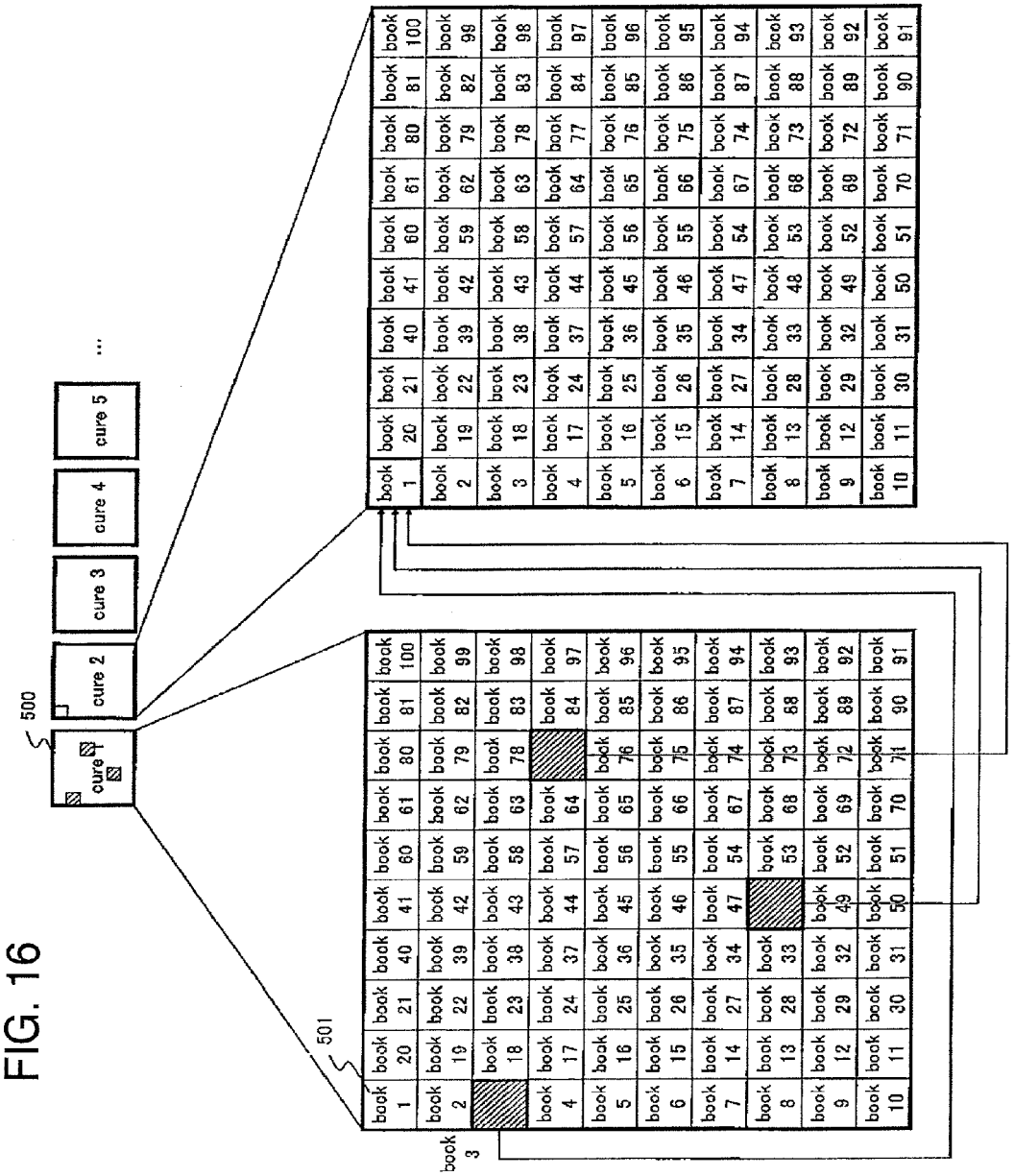
FIG. 16 is a diagram for explaining cures and books on optical information recording media in a sixth embodiment.

Embodiment 6 will now be described. A configuration of an optical information recording and reproducing apparatus is similar to that in the embodiment 1, and consequently description thereof will be omitted. FIG. 16 is a diagram for explaining cures and books on the optical information recording media.

A cure 500 represents an area where precure and postcure are conducted once. A book 501 represents an area where recording and reproducing are conducted. Data are recorded in order in the rotation direction and radial direction on the optical information recording media with a cure taken as the unit.

At the time of data recording, precure is first conducted in a cure unit area.

Then, data are recorded in order by taking a book in the cure as the unit. For example, supposing that there are 100 books in each cure and there are 300 pages in each book, 300 pages are recorded in a certain book in a cure by angular multiplexing, 300 pages are recorded in the next book in the same way, and data are recorded in all books in the cure by conducting this for 100 books. Then, postcure is conducted, and verify processing of data in the cure is conducted.

For example, precure is conducted on cure 1, and data are recorded in book 1 to book 100 in the cure 1. Then, postcure is conducted on the cure 1 and verify processing on the cure 1 is conducted. It is now supposed that 100 pages among data recorded in book 3 in the cure 1 cause a verify error at this time. Furthermore, it is supposed that 100 pages among data recorded in book 48 in the cure 1 cause a verify error. Furthermore, it is supposed that 100 pages among data recorded in book 77 in the cure 1 cause a verify error.

In this case, data that have caused a verify error among data recorded in the book 3, the book 48 and the book 77 in the cure 1 are re-recorded in book 1 in the cure 2 by retry.

And unless, for example, book 1 in the cure 2 causes a verify error when verify processing is conducted on the cure 2, the book 1 is registered in a management area on the optical information recording media as alternating data.

Owing to the configuration described heretofore, in the sixth embodiment of the present invention, verify errors which have occurred not in book units but in page units are collected and recorded by taking a book as the unit. As compared with the first embodiment, consumption of recording areas on the optical information recording media can be further suppressed.

By the way, if retry data of verify errors that have occurred in page units is less than a book unit, the retry data may be copied to compensate shortage of the book unit. As a result, reliability of information is further improved.

Embodiment 7

Figure 17:
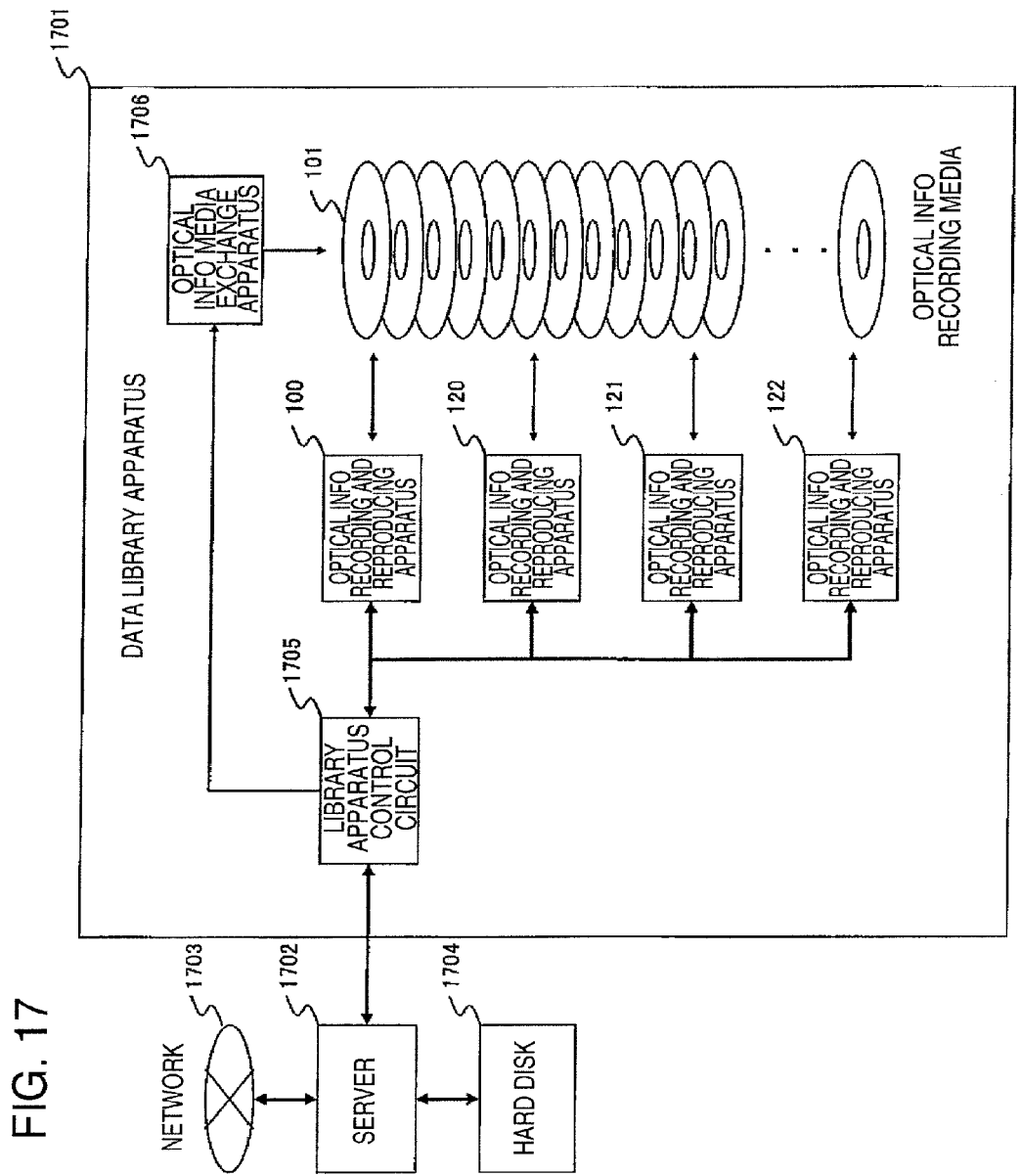
FIG. 17 is a block diagram showing a configuration of an optical information recording and reproducing apparatus in a seventh embodiment.

FIG. 17 is a block diagram showing a configuration of a data library apparatus in a seventh embodiment according to the present invention. A data library apparatus 1701 records data accumulated on a hard disk 1704 from a network 1703 via a server 1702 onto optical information recording media. Or the data library apparatus 1701 reproduces data from the optical information recording media and sends the data to the network 1703 via the server 1702. The server 1702 controls the hard disk 1704 and the data library apparatus 1701 and manages data sent from the network 1703. The hard disk 1704 is controlled by the server 1702 to conduct recording and reproducing of data sent from the network 1703.

A plurality of optical information recording media 101 are stored in the data library apparatus 1701, selected by an optical information media exchange apparatus 1706, and attached to optical information recording and reproducing apparatuses 100, 120, 121 and 122 to record and reproduce data. The optical information recording and reproducing apparatuses 100, 120, 121 and 122 are controlled by a library apparatus control circuit 1705 to conduct data recording and reproducing on the optical information recording media 101. The optical information recording media exchange apparatus 1706 is controlled by the library apparatus control circuit 1705 to exchange optical information recording media attached to the optical information recording and reproducing apparatuses 100, 120, 121 and 122.

In response to a request given by the server 1702, the library apparatus control circuit 1705 controls the optical information recording media exchange apparatus 1706 to select desired optical recording media from the plurality of optical information recording media and send the selected optical recording media to the optical information recording and reproducing apparatuses 100, 120, 121 and 122.

The data library apparatus 1701 incorporates a plurality of optical information recording and reproducing apparatuses, and the data library apparatus 1701 can conduct recording and reproducing on a plurality of optical information recording media simultaneously. As a result, the data library apparatus 1701 can record and reproduce data fast.

For example, optical information recording media are attached to the optical information recording and reproducing apparatuses 100, 120, 121 and 122, respectively. The optical information recording and reproducing apparatuses 100, 120 and 121 record data simultaneously. At this time, three optical information recording and reproducing apparatuses operate in parallel. As a result, data can be recorded at a speed which is three times as fast as a speed of one optical information recording and reproducing apparatus.

And verify processing is conducted simultaneously. If a verify error occurs, retry data are collected from respective optical information recording and reproducing apparatuses and the optical information recording and reproducing apparatus 122 records the collected retry data on optical information recording media. One of the optical information recording and reproducing apparatuses is dedicated to retry. If a verify error occurs, the dedicated optical information recording and reproducing apparatus conducts retry collectively. As a result, the transfer rate of the whole data library apparatus does not fall.

The seventh embodiment of the present invention has the configuration described heretofore. If recorded data causes a verify error, therefore, the optical information recording and reproducing apparatus dedicated for retry records the data collectively. Accordingly, lowering of the transfer rate of the data library apparatus can be prevented.

The present invention is not restricted to the above-described embodiments, but various modifications are included. For example, the embodiments have been described in detail in order to describe the present invention intelligibly, and each of the embodiments is not necessarily restricted to the configuration having all described components. Furthermore, it is possible to replace a part of a configuration in an embodiment by a part of a configuration in another embodiment, and it is possible to add a part of a configuration in an embodiment to a configuration in another embodiment. Furthermore, as for a part of a configuration in each embodiment, it is possible to conduct addition, deletion, and replacement of a part of a configuration in another embodiment.

Furthermore, the present invention is not restricted to the angle multiplex system. The present invention can be applied to the shift multiplex system or the like. Furthermore, the embodiments have been described presupposing optical information recording media of write-once type. If it is possible to implement media, apparatus or the like that can be rewritten even if cure processing is conducted, however, optical information recording media of rewritable type may be used.

As for each of the above-described configurations, functions, processing units, and processing means, a part or the whole thereof may be implemented by hardware by, for example, designing using integrated circuits. Each of the above-described configurations, functions, and the like may be implemented by software by using a processor which interprets and executes a program implementing each function. Information such as a program, a table, and a file implementing each function can be stored in a storage device such as a memory, hard disk, or an SSD (Solid State Drive) or recording media such as an IC card or an SD card.

As for control lines and information lines, those considered to be necessary for description are shown. All control lines and information lines on products are not necessarily shown. As a matter of fact, it may be considered that almost all components are connected to each other.

REFERENCE SIGNS LIST

S401: Recorded data capacity determination processing
S402: Cure disposition and ECC addition processing
S403: Cure disposition, copy paste and ECC addition processing
S404: Position control processing
S405: Precure processing
S406: Data corresponding to cure capacity recording processing
S407: Postcure processing
S408: Data corresponding to cure capacity verify processing
S409: Verify error determination processing
S410: Cure re-disposition processing
S411: Recording completion determination processing

The invention claimed is:

1. An optical information recording and reproducing method for recording data on optical information recording media and reproducing data from the optical information recording media, the optical information recording and reproducing method comprising the steps of:
    storing data to be recorded on the optical information recording media into a storage unit;
    dividing the data into a plurality of data strings and adding an error detection code to each data string;
    executing precure on a first cure unit area of the optical information recording media as a preprocess for recording;
    recording the data stored in the storage unit into the first cure unit area subjected to the precure;
    executing postcure on the first cure unit area subjected to the data recording, as a postprocess for recording;
    executing verify to determine whether data in the first cure unit area subjected to the postcure can be read out correctly using the error detection codes in the data in the first cure unit; and
    responsive to detection of data causing a verify error in the first cure unit area by the verify, recording retry data for the verify error into a second cure unit area on the optical information recording media different from the first cure unit area,
    wherein the retry data for the verify error is caused to cut in data to be recorded and is recorded in the second cure unit area,
    wherein the retry data for the verify error is caused to cut in next data to be recorded and is recorded in the second cure unit area, and
    wherein data on the storage unit that has caused a verify error is copied and pasted to be caused to cut in next data to be recorded, the next data to be recorded is shifted and moved by that amount, and the retry data for the verify error is recorded in the second cure unit area.

2. An optical information recording and reproducing method for recording data on optical information recording media and reproducing data from the optical information recording media, the optical information recording and reproducing method comprising the steps of:
    storing data to be recorded on the optical information recording media into a storage unit; dividing the data into a plurality of data strings and adding an error detection code to each data string;
    executing precure on a first cure unit area of the optical information recording media as a preprocess for recording;
    recording the data stored in the storage unit into the first cure unit area subjected to the precure;
    executing postcure on the first cure unit area subjected to the data recording, as a postprocess for recording;
    executing verify to determine whether data in the first cure unit area subjected to the postcure can be read out correctly using the error detection codes in the data in the first cure unit; and
    responsive to detection of data causing a verify error in the first cure unit area by the verify, recording retry data for the verify error into a second cure unit area on the optical information recording media different from the first cure unit area,
    wherein the retry data for the verify error is caused to cut in data to be recorded and is recorded in the second cure unit area,
    wherein the retry data for the verify error is caused to cut in next data to be recorded and is recorded in the second cure unit area, and
    wherein an address of data on the storage unit that has caused a verity error is shifted to cause the data to cut in next data to be recorded in the first cure unit, an address of the next data to be recorded is shifted by that amount, data is read out based on the shifted address and recorded on the optical information recording media.

3. An optical information recording and reproducing method for recording data on optical information recording media and reproducing data from the optical information recording media, the optical information recording and reproducing method comprising the steps of:
    storing data to be recorded on the optical information recording media into a storage unit;
    executing precure on a first cure unit area of the optical information recording media as a preprocess for recording;
    recording the data stored in the storage unit into the first cure unit area subjected to the precure;
    executing postcure on the first cure unit area subjected to the data recording, as a postprocess for recording;
    executing verify to determine whether data in the first cure unit area subjected to the postcure can be read out correctly; and
    responsive to detection of data causing a verify error in the first cure unit area by the verify, recording retry data for the verify error into a second cure unit area on the optical information recording media different from the first cure unit area,
    wherein the retry data for the verify error is recorded in a plurality of places in the second cure unit, and
    wherein from among data recorded in the plurality of places, data in one place that has not caused a verify error is selected, and the selected data is registered as alternating data.

* * * * *